US009680003B2

(12) United States Patent
Qin et al.

(10) Patent No.: US 9,680,003 B2
(45) Date of Patent: Jun. 13, 2017

(54) TRENCH MOSFET SHIELD POLY CONTACT

(71) Applicant: FREESCALE SEMICONDUCTOR, INC., Austin, TX (US)

(72) Inventors: Ganming Qin, Chandler, AZ (US); Edouard D. De Fresart, Tempe, AZ (US); Pon Sung Ku, Gilbert, AZ (US); Michael F. Petras, Phoenix, AZ (US); Moaniss Zitouni, Gilbert, AZ (US); Dragan Zupac, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/671,590

(22) Filed: Mar. 27, 2015

(65) Prior Publication Data

US 2016/0284838 A1    Sep. 29, 2016

(51) Int. Cl.
| | |
|---|---|
| H01L 29/78 | (2006.01) |
| H01L 29/66 | (2006.01) |
| H01L 29/06 | (2006.01) |
| H01L 29/40 | (2006.01) |
| H01L 29/10 | (2006.01) |
| H01L 29/423 | (2006.01) |

(52) U.S. Cl.
CPC ...... *H01L 29/7813* (2013.01); *H01L 29/0634* (2013.01); *H01L 29/0696* (2013.01); *H01L 29/1095* (2013.01); *H01L 29/402* (2013.01); *H01L 29/4236* (2013.01); *H01L 29/66734* (2013.01)

(58) Field of Classification Search
CPC ............. H01L 29/7813; H01L 29/4236; H01L 29/1095; H01L 29/66734; H01L 29/0695
See application file for complete search history.

(56) References Cited

U.S. PATENT DOCUMENTS

| | | |
|---|---|---|
| 5,355,008 A | 10/1994 | Moyer |
| 5,814,858 A | 9/1998 | Williams |
| 5,973,361 A | 10/1999 | Hshieh |
| 6,583,010 B2 | 6/2003 | Mo |
| 6,683,363 B2 | 1/2004 | Challa |
| 7,109,552 B2 | 9/2006 | Wu |
| 7,319,256 B1 | 1/2008 | Kraft et al. |
| 7,378,317 B2 | 5/2008 | de Fresart |
| 7,510,938 B2 | 3/2009 | de Fresart |
| 7,855,415 B2 | 12/2010 | Challa et al. |
| 8,143,126 B2 | 3/2012 | Chen et al. |
| 8,431,989 B2 | 4/2013 | Bhalla et al. |
| 8,476,133 B2 | 7/2013 | Mo et al. |
| 8,563,377 B2 | 10/2013 | Yedinak et al. |

(Continued)

*Primary Examiner* — Quoc Hoang

(57) ABSTRACT

A recess is formed at a semiconductor layer of a device to define a plurality of mesas. An active trench portion of the recess residing between adjacent mesas. A termination portion of the trench residing between the end of each mesa and a perimeter of the recess. The transverse spacing between the mesas and the lateral spacing between the mesas and an outer perimeter of a recess forming the mesas are substantially the same. A shield structure within the trench extends from the region between the mesas to the region between the ends of the mesas and the outer perimeter of the recess forming the mesas. A contact resides between a shield electrode terminal and the shield portion residing in the trench.

14 Claims, 21 Drawing Sheets

(56) References Cited

U.S. PATENT DOCUMENTS

| | | |
|---|---|---|
| 9,397,213 B2 * | 7/2016 | Qin .................. H01L 21/26513 |
| 2002/0019099 A1 | 2/2002 | Williams |
| 2002/0074585 A1 | 6/2002 | Tsang et al. |
| 2004/0021195 A1 | 2/2004 | Kurosaki |
| 2006/0249785 A1 | 11/2006 | Bhalla |
| 2006/0273385 A1 | 12/2006 | Hshieh |
| 2006/0273386 A1 | 12/2006 | Yilmaz |
| 2007/0114599 A1 | 5/2007 | Hshieh |
| 2008/0135931 A1 | 6/2008 | Challa |
| 2008/0227269 A1 | 9/2008 | Ma |
| 2009/0008709 A1 | 1/2009 | Yedinak et al. |
| 2009/0267689 A1 | 10/2009 | Zupac |
| 2010/0084705 A1 | 4/2010 | Radic |
| 2010/0140695 A1 | 6/2010 | Yedinak et al. |
| 2011/0024806 A1 | 2/2011 | Radic |
| 2011/0089483 A1 | 4/2011 | Reynes |
| 2011/0204440 A1 | 8/2011 | Bhalla |
| 2012/0037954 A1 | 2/2012 | Hshieh |
| 2013/0187240 A1 | 7/2013 | Takano |
| 2013/0307060 A1 | 11/2013 | Wang |
| 2013/0344667 A1 | 12/2013 | Qin |
| 2014/0231910 A1 | 8/2014 | Willmeroth et al. |
| 2014/0374871 A1 | 12/2014 | Hirabayashi et al. |
| 2016/0064546 A1 | 3/2016 | Zitouni et al. |

\* cited by examiner

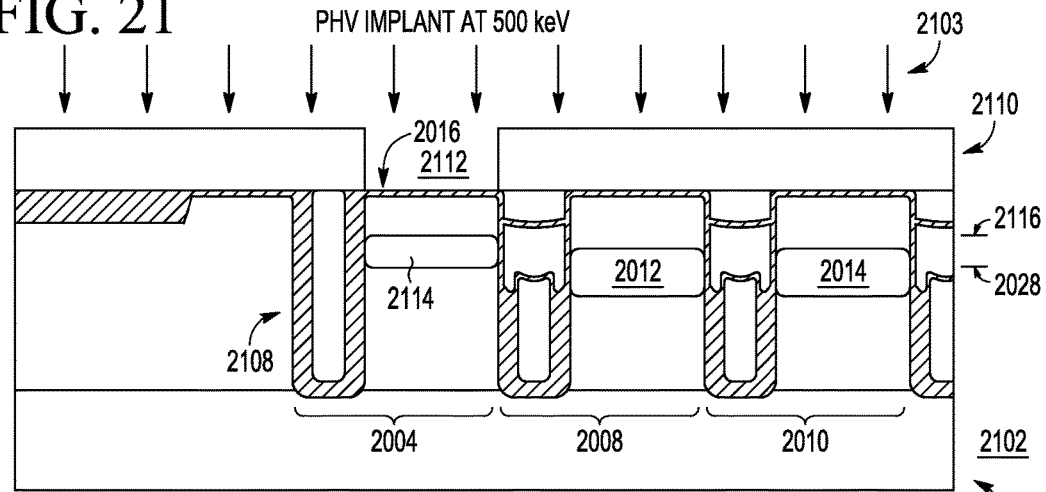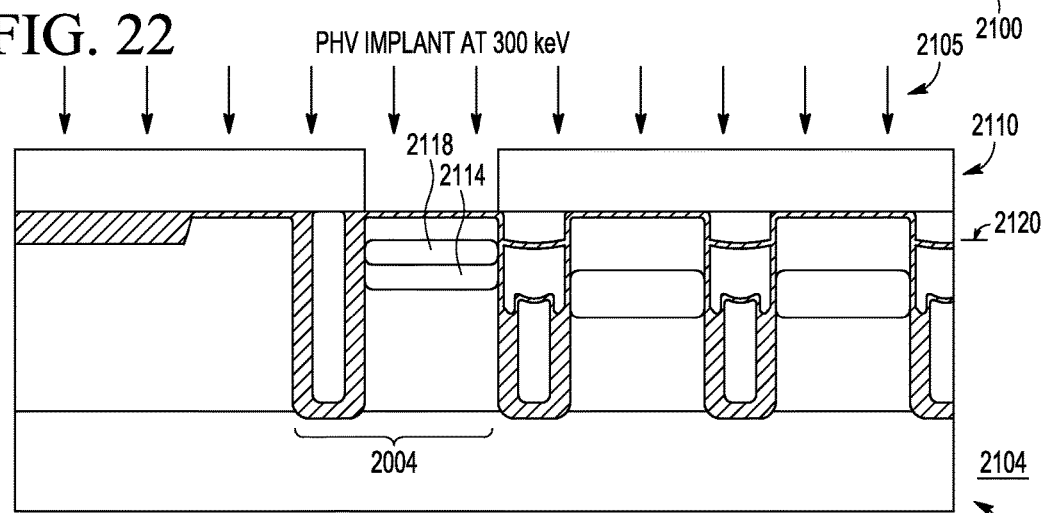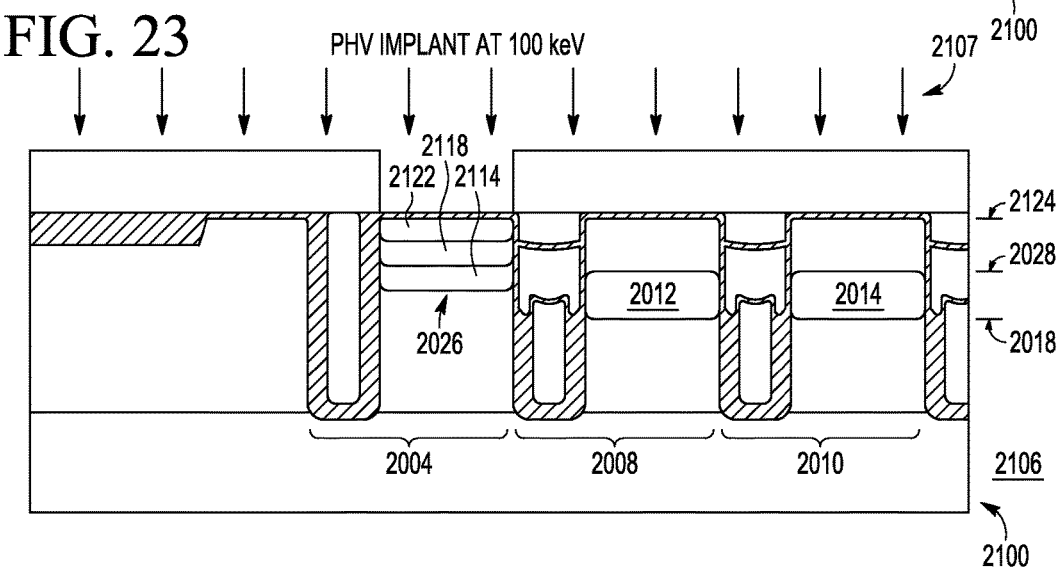

TRENCH MOSFET SHIELD POLY CONTACT

BACKGROUND

Field of the Disclosure

The present disclosure relates generally to semiconductor devices and, more particularly, to trench gate field effect transistors.

Description of the Related Art

Vertical transistors, such as trench gate field effect transistors (FETs) frequently are utilized in high-voltage applications. Such transistors often leverage the reduced surface field (RESURF) effect to achieve a relatively low on resistance ($R_{DSon}$) while maintaining a relatively high breakdown voltage ($BV_{dss}$). RESURF-based trench gate architectures employ a one-dimensional or two-dimensional array of transistors in an epitaxial layer that overlies a substrate that itself serves as part of a drain electrode structure. Each transistor has an active region, referred to as a mesa that is defined by a trench extending into the epitaxial layer. Well regions are formed in the mesa regions of the epitaxial layer between adjacent trenches, and a source electrode is connected to the mesa regions via source contact region. Conventionally, for an N-type RESURF trench transistor, the well region is provided as a P– well in which an N+ source region is formed adjacent to the sidewall of a corresponding trench. Adjacent N+ source regions for adjacent cells are isolated through the formation of a P+ region between the two N+ source regions in the P– well. The P+ region is formed through the use of an N+ mask over the region that is to become the P+ region during the implant process for the N+ source regions. It is this P+ region that acts as the channel of the vertical transistor. A dielectric layer is then formed overlying the trenches and mesas, and a contact between the N+ regions and the source electrode metallization is formed through etching of a contact opening in the dielectric layer using a source contact mask. P-type RESURF trench transistors may fabricated in a similar manner, but with regions of opposite conductivity types than those used for the N-type RESURF trench transistor.

The masks used in the formation of the P+ region and in the formation of the source contact are subject to various photolithography design rules. The dimensions of the doped regions within mesa regions therefore are subject to the minimum size and spacing rules set forth by these photolithography design rules. The spacing between trenches (often referred to as the "silicon width" or "Sx") is a primary factor in the extent of the RESURF effect that may be achieved in a trench gate FET design. The conventional approach to trench gate FET design and its reliance on masks for formation of isolation regions and source contacts for the cells of the transistor thus limits the ability to achieve the reduced spacing between trenches and the enhanced RESURF effect that otherwise would result.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

FIG. 21 illustrates a cross-section view of a workpiece during a chained ion implant process to form the semiconductor device of FIG. 20 in accordance with some embodiments.

FIG. 22 illustrates another cross-section view of the workpiece of FIG. 21 during the chained ion implant process to form the semiconductor device of FIG. 20 in accordance with some embodiments.

FIG. 23 illustrates yet another cross-section view of the workpiece of FIG. 21 during the chained ion implant process to form the semiconductor device of FIG. 20 in accordance with some embodiments.

DETAILED DESCRIPTION

Figure 1:
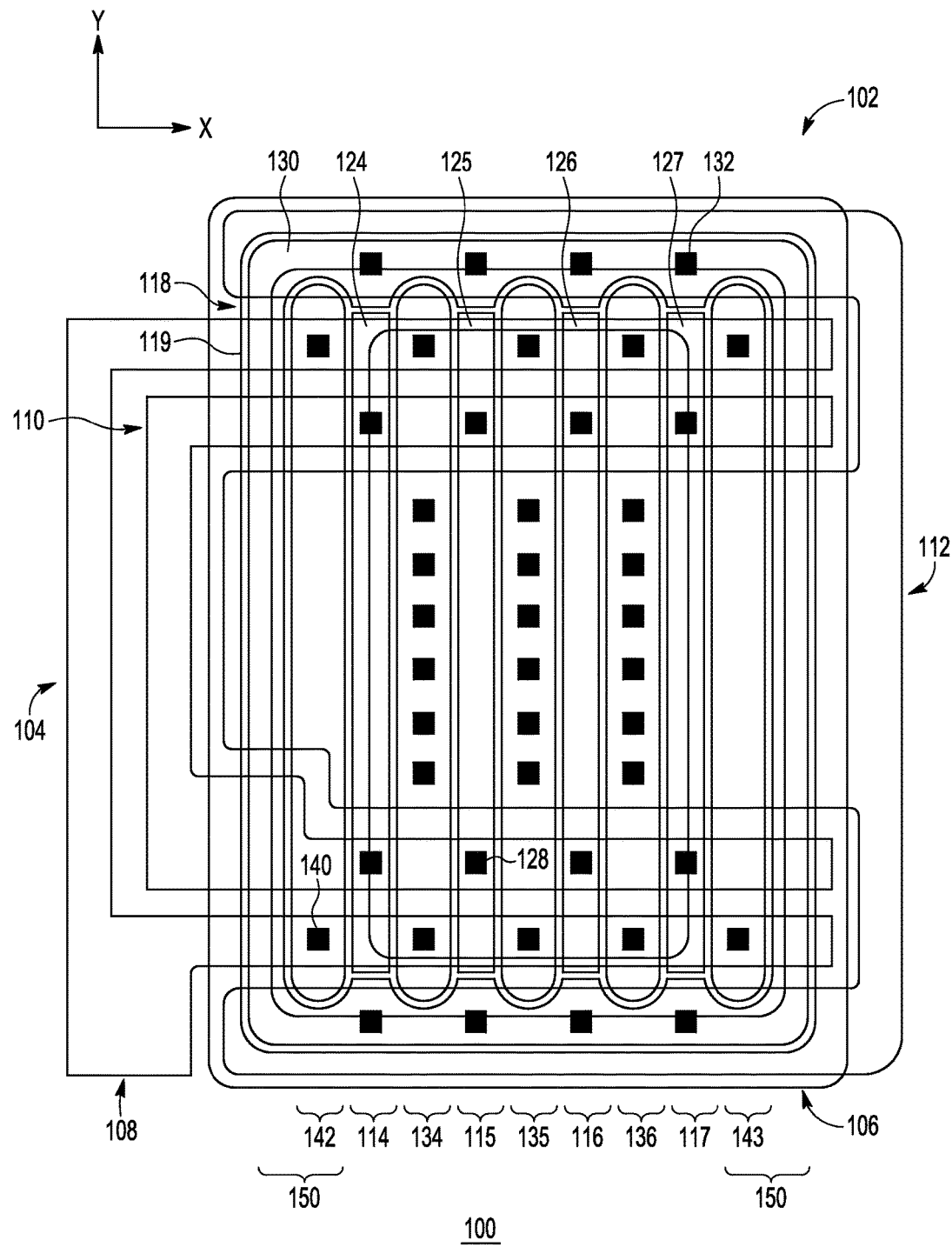
FIG. 1 is a simplified plan view of a semiconductor device employing a trench gate field effect transistor (FET) in accordance with some embodiments.

FIGS. 1-33 illustrate example techniques for fabricating a semiconductor device incorporating a trench gate field effect transistor (FET) with a high-density cell array and effective edge termination. In at least one embodiment, the trench gate FET includes an array of cells formed in an active region of a semiconductor layer of one conductivity type (e.g., N-type) overlying a substrate. Each cell includes a mesa defined by a trench extending into the semiconductor layer and a gate electrode and corresponding segment of a shield electrode formed within the trench under a thick top oxide layer (or other insulating material).

The spacing between the mesas and the spacing between the mesas and an outer perimeter of a recess forming the mesas are substantially the same. A shield structure within the trench extends from the region between the mesas to the region between the ends of the mesas and the outer perimeter of the recess forming the mesas. A contact resides between a shield electrode terminal and the shield portion residing in the trench. The perimeter of the contact includes a point that is smallest equidistant from two corresponding mesas, and a lateral distance of an outer perimeter of the recess.

Various terms of orientation, such as "above," "below," "bottom," and "top,", "lateral," and "transverse, are used herein to describe spatial relationships between different elements. However, unless specifically stated otherwise, terms are not intended to imply a particular spatial orientation relative to a gravitational direction or other external fixed reference point, but rather are used in reference to the particular orientation presented in the drawing associated with the corresponding description. Further, the terms "first," "second," "third," and the like are used in the detailed description to distinguish between somewhat similar elements, and is not intended to specify a particular spatial arrangement, sequence, or chronological order unless otherwise noted.

For ease of illustration, examples and embodiments are described in the context of semiconductor devices formed using silicon (Si) as a semiconductor material. However, the techniques described herein are not limited to this context, but instead may employ any of a variety of semiconductor materials, such as SiGe, GaN and Si, SiGe and GaAs, GaAs and Ge, Si and $Si_{1-y}C_y$, SiC and AN, SiC and BP, InGaN, and various other type IV, II-V and II-VI compounds and combinations thereof. Further, for ease of description examples and embodiments are described in the example context of a P-channel device. However, the techniques described herein similarly may be employed for the manufacture and use of N-channel devices. Accordingly, while various semiconductor regions are described herein as being of N-type or P-type in the example context of a P-type trench gate FET device, one of ordinary skill in the art will understand that regions of the opposite conductivity type may be substituted in the context of an N-type trench gate FET device using the teachings provided herein. Likewise, the techniques described herein are not limited to a MOSFET context, but instead may be employed to fabricate any of a variety of transistor devices, as insulated gate bipolar transistor (IGBT) devices and other types of bipolar transistors, using the guidelines provided herein.

FIG. 1 illustrates a simplified plan view of a semiconductor device 100 employing a trench gate metal oxide silicon field effect transistor (MOSFET) 102 in accordance with at least one embodiment. The trench gate FET 102 may be advantageously employed in any of a variety of circuits in which power MOSFETS often are utilized, such as in alternating current (AC)-direct current (DC) converters, DC-DC converters, motor drive controllers, and the like.

In the depicted example, the trench gate FET 102 includes a semiconductor layer 106 overlying a substrate (not shown in FIG. 1) and one or more metallization layers 104 overlying the semiconductor layer 106. The one or more metallization layers 104 form three terminal electrodes for the trench gate FET 102, including a body terminal electrode 108, a gate terminal electrode 110, and a combined source/shield terminal electrode 112, and a drain electrode (not shown in FIG. 1) is formed at the bottom surface of the substrate underlying the semiconductor layer 106.

A recess, referred to herein as a device trench, has been formed at the semiconductor layer 106 to define an array of mesas at locations 134-136, 142 and 143. These reference numbers can also be used to refer to a particular mesa. For example, mesa 135 would be understood to be the mesa located at location 135. The device trench defines an array of active trenches, one active trench between each adjacent pair of mesas (a mesa pair), such as active trenches 114, 115, 116, and 117 (collectively, "active trenches 114-117"), and a termination trench 118 that is concentric to the outer perimeter 119 of the device trench and therefore encircles and joins the active trenches 114-117 at opposing sides of the termination trench.

In order to facilitate the etch process that defines the mesas and outer perimeter of the trench, a distance between mesa pairs, and between each mesa and the outside perimeter of the device trench, is selected to be substantially the same. For example, the drawn trench spacing can be selected to be 0.8μ, in both the transverse dimension between mesas and in the lateral dimension between the end of a mesa and the outer perimeter of the recess. In other embodiments, the active trenches 114-117 and the termination trench 118 may be implemented as separate, non-joined, trenches. As described in greater detail below, each of the active trenches 114-117 includes a separate gate electrode (gate electrodes 124, 125, 126, and 127, respectively) that substantially conforms to the shape of the active trench. Each of the gate electrodes 124, 125, 126, and 127 is conductively connected to the gate terminal electrode 110 via one or more contact plugs 128. A single continuous shield electrode 130 is disposed in the termination trench 118 (termination shield portions) and in the active trenches 114-117 underneath the gate electrodes, referred to as active shield portions). The shield electrode 130 is conductively connected to the source/shield terminal electrode 112 via one or more contact plugs 132.

The mesas at regions 134-136 each include a source contact region (not shown in FIG. 1) of the same conductivity type (e.g., N-type), formed over a buried body region (not shown in FIG. 1) of the opposite conductivity type (e.g., P-type). The source contact regions and buried body regions extend in a lateral direction along the length (Y-axis) of the corresponding mesa region. The buried body regions are conductively connected to the body terminal electrode 108 via body link regions (not shown in FIG. 1) in the semiconductor layer 106 and conductive plugs 140 extending between the body link regions and the body terminal electrode 108. As described in greater detail below, the buried body regions and the source contact regions may be formed through the use of blanket ion implant processes, thereby allowing the source contact regions to act as self-aligned contacts over which the metallization of the source/shield terminal electrode 112 may be directly deposited or otherwise formed.

The mesa 142, between the termination trench 118 and the active trench 114, and the mesa 143, between the active trench 117 and the termination trench 118, together form an edge termination structure 150 for the inner, or center, cells formed by the active trenches 114-117 and the mesas 134-136. Each of mesas 142 and 143 includes a body region (not shown in FIG. 1) of the same conductivity type as the buried body regions of the mesas 134-136. These body regions extend the length of the mesa regions 142 and 143 and substantially conform to the shapes of the mesas 142 and 143. In at least one embodiment, the body regions of the mesas 142 and 143 are formed at a shallower depth than the buried body regions of the mesas 134-136.

Figure 2:
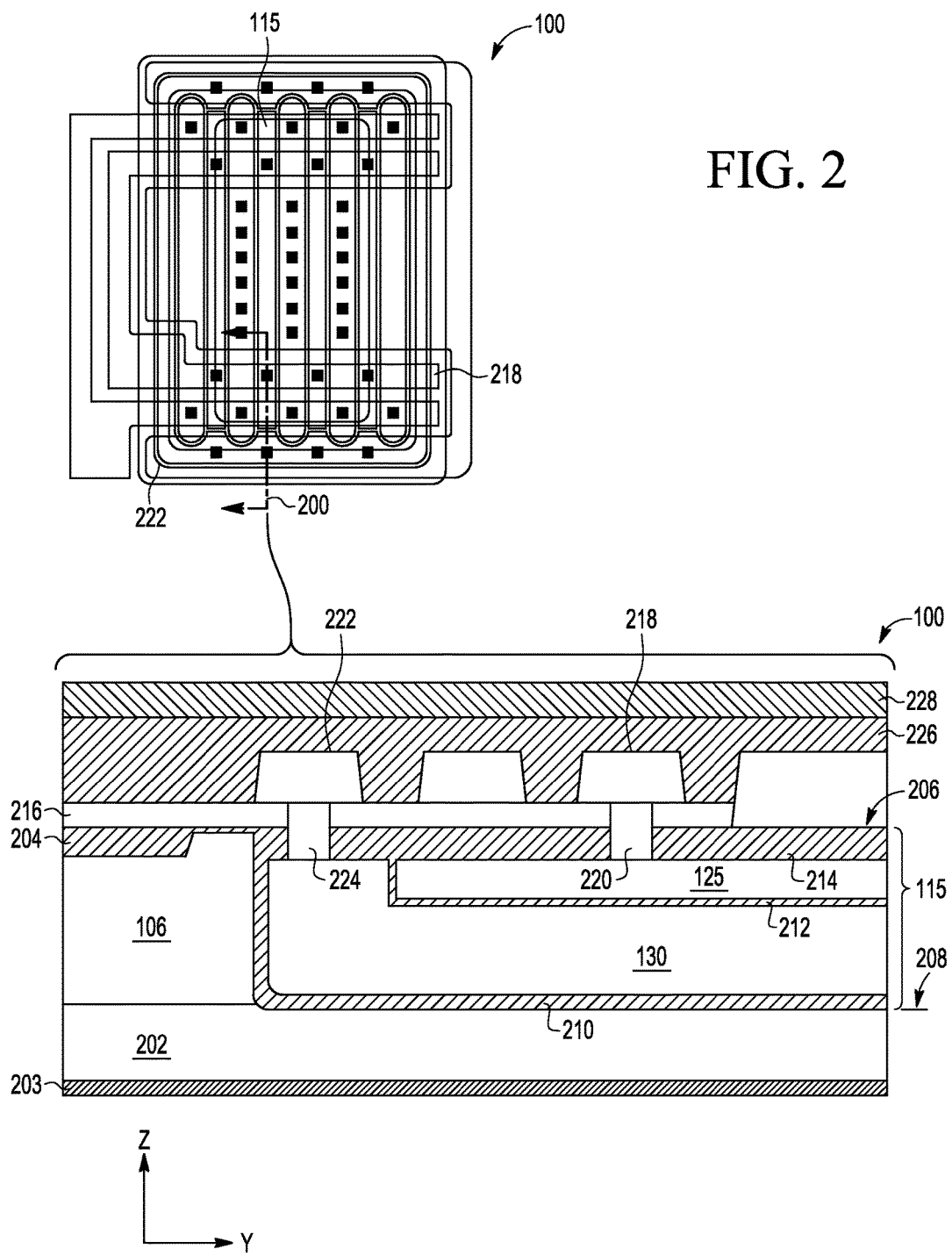
FIG. 2 is a cross-section view of an active trench region of the semiconductor device of FIG. 1 in accordance with some embodiments.

FIG. 2 illustrates a cross-section view of the semiconductor device 100 along cut line 200 aligned with the active trench 115 in accordance with at least one embodiment. The other active trenches 114, 116, and 117 (FIG. 1) are similarly configured in the manner described below. As depicted, the semiconductor device 100 includes a wafer having an upper semiconductor layer 106. For example, the semiconductor layer 106 can be an epitaxial layer or otherwise formed. A metallization layer 203 for a drain electrode (not shown) may be formed on the opposite side of the substrate 202 from the layer 106. In one embodiment, the substrate 202 includes a heavily-doped N+ silicon arsenide (SiAs) substrate. However, the substrate 202 may be formed of any of a variety of semiconductor materials or combinations thereof, such as gallium arsenide (GaAs), silicon germanium (SiGe), silicon-on-insulator (SOI), silicon (Si), monocrystalline silicon, indium (In), and the like. The semiconductor layer 106 may include a lightly doped N-type epitaxial layer, and thus is also referred to herein as the "epi layer 106." However, the combination of a highly doped layer surmounted by a layer of substantially uniform light doping as represented by the substrate 202 and the semiconductor layer 106 may be achieved in other ways known in the art.

In the region represented by the cross-section view of FIG. 2, the epi layer 106 includes a shallow trench isolation (STI) region 204 and the active trench 115. The shallow trench isolation region 204 may be formed by etching near the perimeter of the active area of the trench gate FET 102 and depositing or otherwise forming $SiO_2$ or other suitable insulating material in the shallow trench.

The trench 115 extends into the epi layer 106 from a surface 206 of the epi layer 106 (hereinafter, "semiconductor surface 206") to a depth 208. As illustrated in FIG. 2, the trench 115 may extend into the substrate 202. As an active trench, trench 115 includes a shielded gate structure insulated from the sidewalls and bottom of the trench 115 by one or more layers of oxide or other suitable insulating material. This shielded gate structure includes the gate electrode 125 above a corresponding segment of the conductive shield electrode 130. The gate electrode 125 and shield electrode 130 may be formed from polysilicon or any of a variety of other suitable conductive materials. The shield electrode 130 is insulated from the bottom of the trench 115 by a thick bottom oxide layer 210 included of $SiO_2$ (on the basis of TEOS) or other suitable dielectric material. The gate electrode 125 is insulated from the shield electrode 130 by an inter-poly dielectric layer 212. A portion 131 of shield electrode 130 is laterally adjacent to, and has an upper surface at substantially the same elevation as the gate electrode 125. The illustrated shield portion extends from the active trench region to the termination trench region. The lateral dimension of the upper portion of the illustrated trench is dimension 92. A thick top oxide layer 214 of $SiO_2$ (on the basis of TEOS) or other suitable dielectric material extends from the top surfaces of the gate electrode 125 and the shield electrode 130 to the semiconductor surface 206.

The epi layer 106 and the structures formed therein are insulated from the metallization forming the electrodes 108 and 110 (FIG. 1) by a top dielectric layer 216 formed overlying the semiconductor surface 206. In the cross-section view of FIG. 2, a portion 218 of the gate terminal electrode 110 is conductively connected to the trench gate electrode 125 using a conductive contact plug 220 formed of tungsten (W) or another suitable conformal conductive material in corresponding contact openings formed in the top dielectric layer 216 and the top oxide layer 214 between the node 218 and the trench gate electrode 125. Similarly, a portion 222 of the source/shield terminal electrode 112 is conductively connected to the shield electrode 130 using a conductive contact plug 224 formed in corresponding contact openings in the top dielectric layer 216 and the top oxide layer 214. According to an embodiment, of the conductive plugs 224 and 220 can be formed simultaneously. A passivation layer 226 and a polyimide layer 228 are formed overlying the metallization forming the electrodes 108-112.

Figure 3:
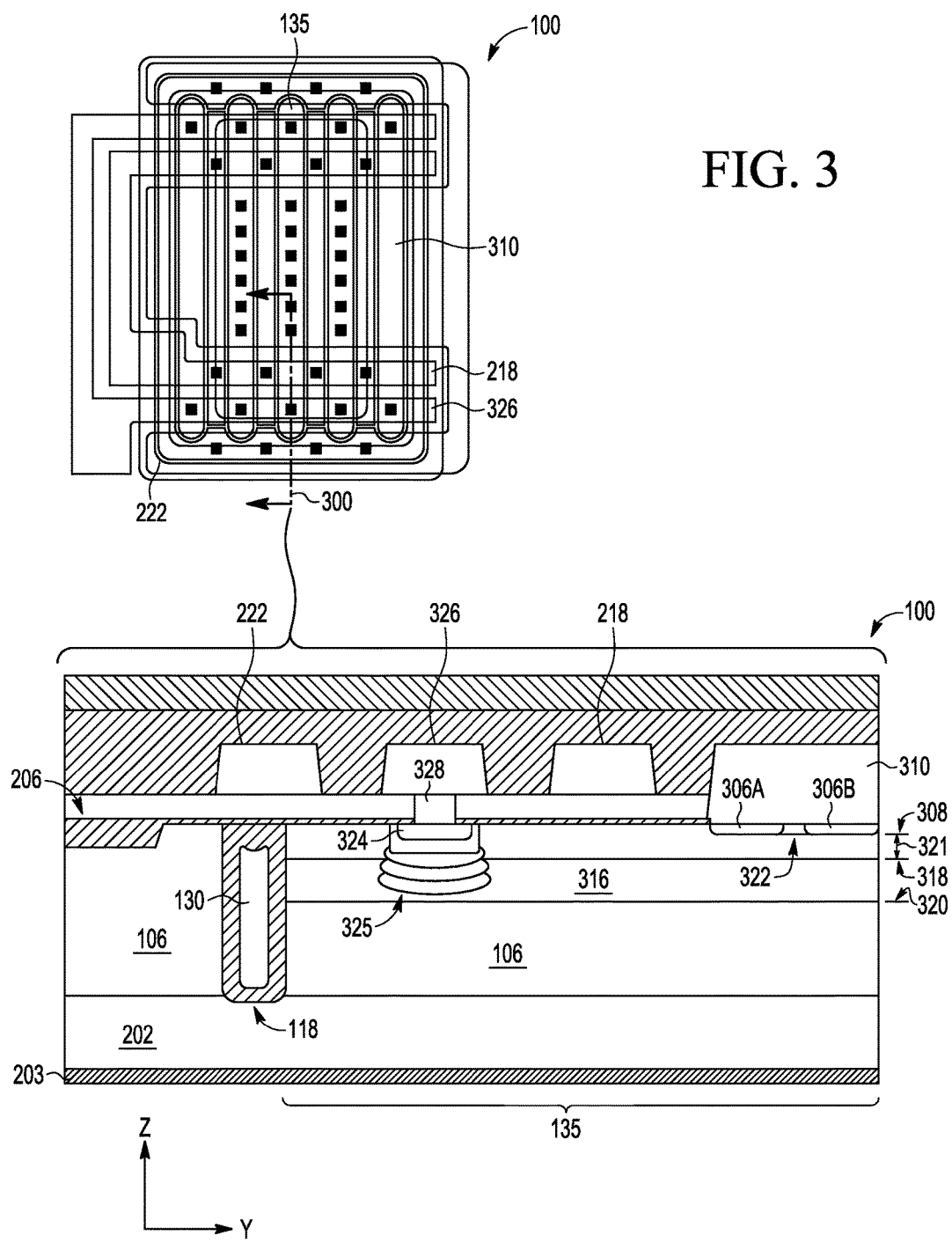
FIG. 3 is a cross-section view of an active mesa region of the semiconductor device of FIG. 1 in accordance with some embodiments.

FIG. 3 illustrates a cross-section view of the semiconductor device 100 along the lateral cut line 300 aligned with the mesa region 135 in accordance with at least one embodiment. The other mesas 134 and 136 are similarly configured in the manner described below. As depicted, the termination trench 118, which defines the lateral extent of the mesa region 134, includes the shield electrode 130 extending in a transverse direction, e.g., perpendicular to the long axis of the mesa region 135, and is insulated from the epi layer 106 by a bottom oxide layer, a top oxide layer, and sidewall oxide layers formed between the shield electrode 130 and the sidewalls of the termination trench 118. The lateral dimension of the shield electrode 130 at this location is dimension 93.

The mesa region 135, illustrated at FIG. 3, includes an N+ source contact region 306 formed at the semiconductor surface 206 and extending to a depth 308 in the epi layer 106. The source contact region 306 is in conductive contact with a portion 310 of the source/shield terminal electrode 112. As described in greater detail below with reference to FIGS. 17-19, the source contact regions may be formed using a blanket ion implant process and the metallization forming the portion 310 of the source/shield electrode 112 (FIG. 1) may be formed directly in contact with the source contact regions 304 and 306, thereby providing self-aligned contacts between source contact regions and the source/shield terminal electrode 112. By way of example, source contact region 306 can include multiple individual N+ regions, e.g., regions 306 and 306B, that have the same size as contacts that are formed at conductive plug locations.

The mesa region 135 further includes a P-type buried body region 316 that extends the length of the mesa region 135. The buried body region 316 is "buried" in that it is formed at a non-zero depth below the semiconductor surface 206, extending from an upper depth 318 to a lower depth 320 of the epi layer 106. The upper depth 318 is deeper into the epi layer 106 than the depth 308 of the source contact regions 304 and 306 such that the source contact regions 304 and 306 are separated from the buried body region 316 by a region 322 of the epi layer 106. A P+ body contact region 324 is formed at the semiconductor surface 206 at or below a node 326 of the body terminal electrode 108 and the body contact region 324 is conductively connected to the node 326 using a conductive plug 328 formed in a contact opening in the top dielectric layer 216. The buried body region 316 in turn is connected to the body contact region 324, and thus the body terminal electrode 108, by a P-doped body link region 325 formed between the buried body region 316 and the body contact region 324. As described in greater detail below, the body link region 325 may be formed using a chained ion implant process, whereby a series of ion implant processes at different implant energies is performed to form a chain of overlapping P-doped regions that extend from the body contact region 324 to the buried body region 316.

Figure 4:
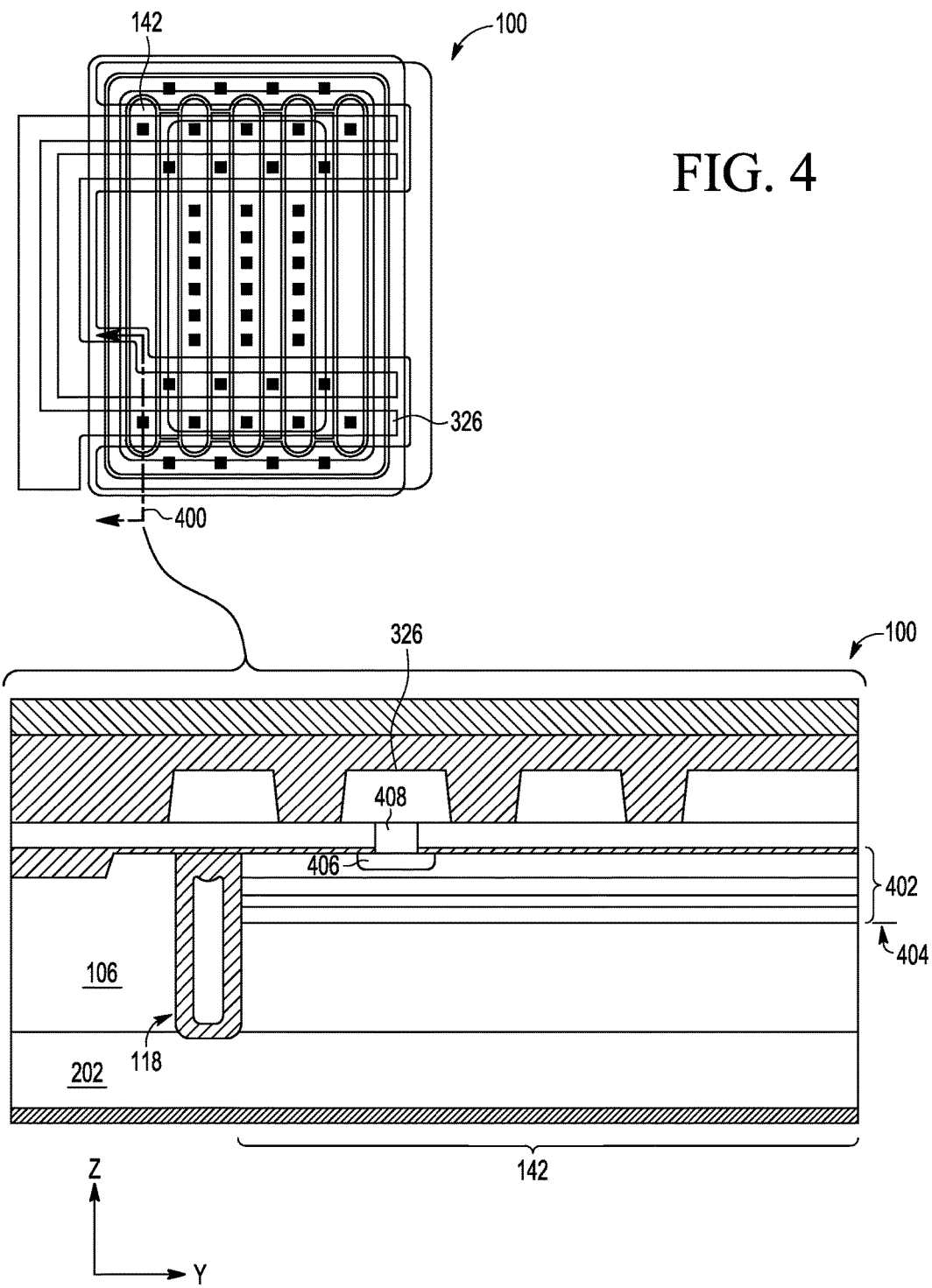
FIG. 4 is a cross-section view of a termination mesa region of the semiconductor device of FIG. 1 in accordance with some embodiments.

FIG. 4 illustrates a cross-section view of the semiconductor device 100 along cut line 400 aligned with the mesa region 142 of the termination cell in accordance with at least one embodiment. The mesa region 143 is similarly configured in the manner described below. As depicted, the mesa region 142 includes a body link region 402 formed in the epi layer 106 and extending the lateral extent of the mesa region 142, which is defined by the trench 118. As with the body link region 325 of FIG. 3, the body link region 402 may be formed using a chained ion implant process so as to form a series of overlapping P-doped regions that extends from a depth 404 to the semiconductor surface 206. In the cross-section view represented by FIG. 4, the body link region 402 is connected to the node 326 of the body terminal electrode 108 via a P+ body contact region 406 formed at the semiconductor surface 206 of the epi layer 106 and a conductive plug 408 formed in a contact opening between the node 326 and the body contact region 406.

Figure 5:
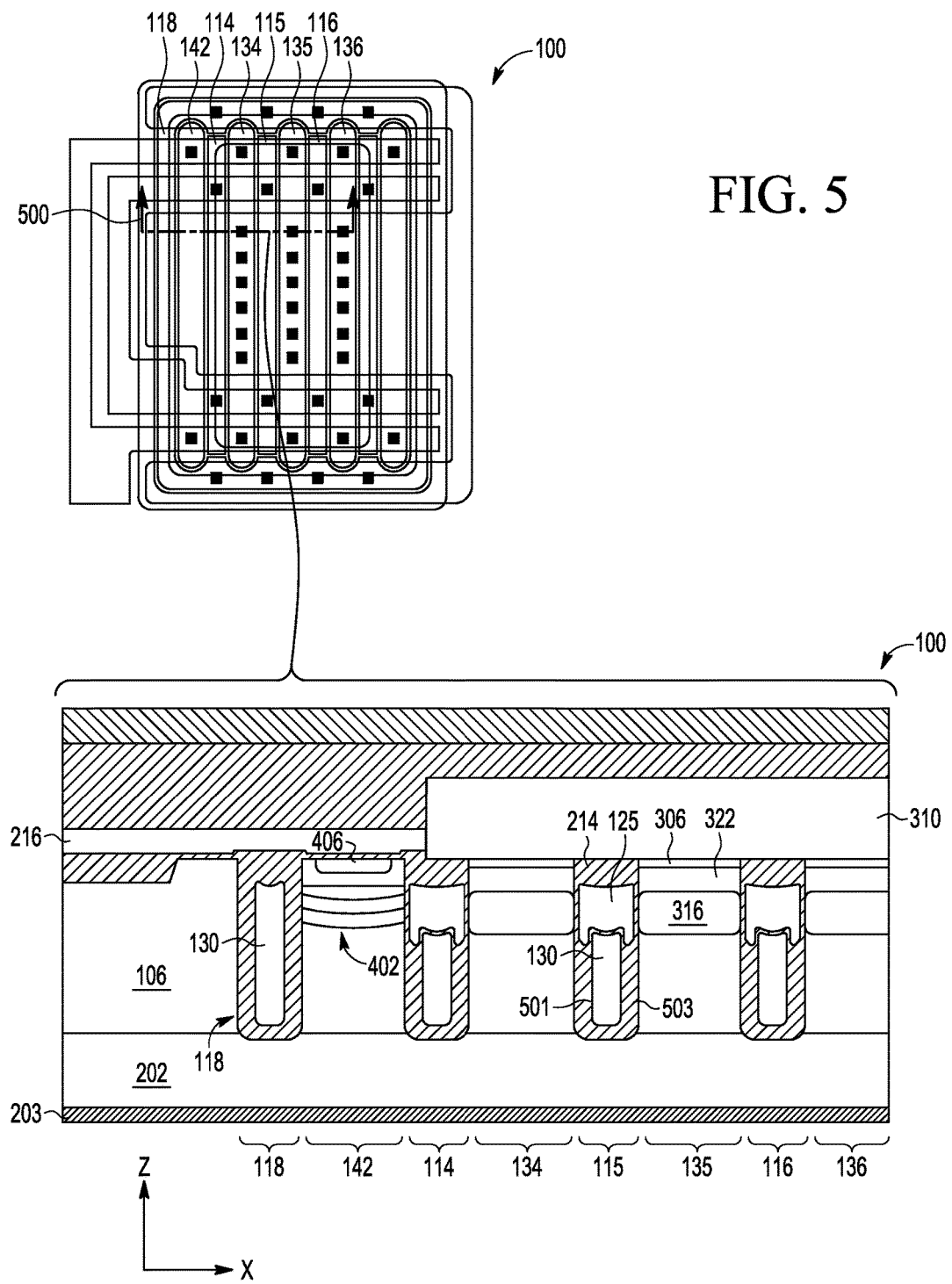
FIG. 5 is a cross-section view of a termination cell and a plurality of active cells below a source electrode metallization of the semiconductor device of FIG. 1 in accordance with some embodiments.

FIG. 5 illustrates a cross-section view of the semiconductor device 100 along cut line 500 extending across the termination trench 118, the mesas 142, 134, 135, and 136, and the active trenches 114, 115, and 116. As shown, in this cross-section the shield electrode 130 has segments that extend along within the trench 118 and underneath the trench gate electrodes of active trenches 114, 115, and 116. The sides of the trench gate electrodes and the sides of the portions of the shield electrode 130 in the active trenches 114, 115, and 116 are insulated from the epi layer 106 of their corresponding mesa pairs by side oxide layers, such as side oxide layers 501 and 503 for the trench 115, and the area of the trench above the trench gate electrode is filled with a thick oxide layer, such as top oxide layer 214 above trench gate electrode 125 in trench 115. The mesa region 142 includes the body link region 402 extending from the sidewall of the termination trench 118 defining one edge of the termination mesa 142 to the adjacent sidewall of the active trench 114 defining the other edge of the mesa region 142, as well as the body contact region 406 formed in the body link region 402. Each of the mesas 134, 135, and 136 includes a buried body region and a source contact region extending between the sidewalls of adjacent trenches and separated by a corresponding region of the epi layer 106, such as the buried body region 316 separated from the source contact region 306 by region 322 of the epi layer 106 in the mesa region 135. The source contact regions 306 are in direct contact with the metallization forming the node 310 of the source/shield terminal electrode 112. The gate electrodes at cross-section view of FIG. 5 have a transverse dimension 95. The shield electrodes at the cross-section view of FIG. 5 heavy transverse dimension 96. The basis at cross-section view of FIG. 5 heavy transverse dimension 97. The deep trench isolation between the shield electrode and the mesas in the cross-section view of FIG. 5 has a transverse dimension 98.

Figure 6:
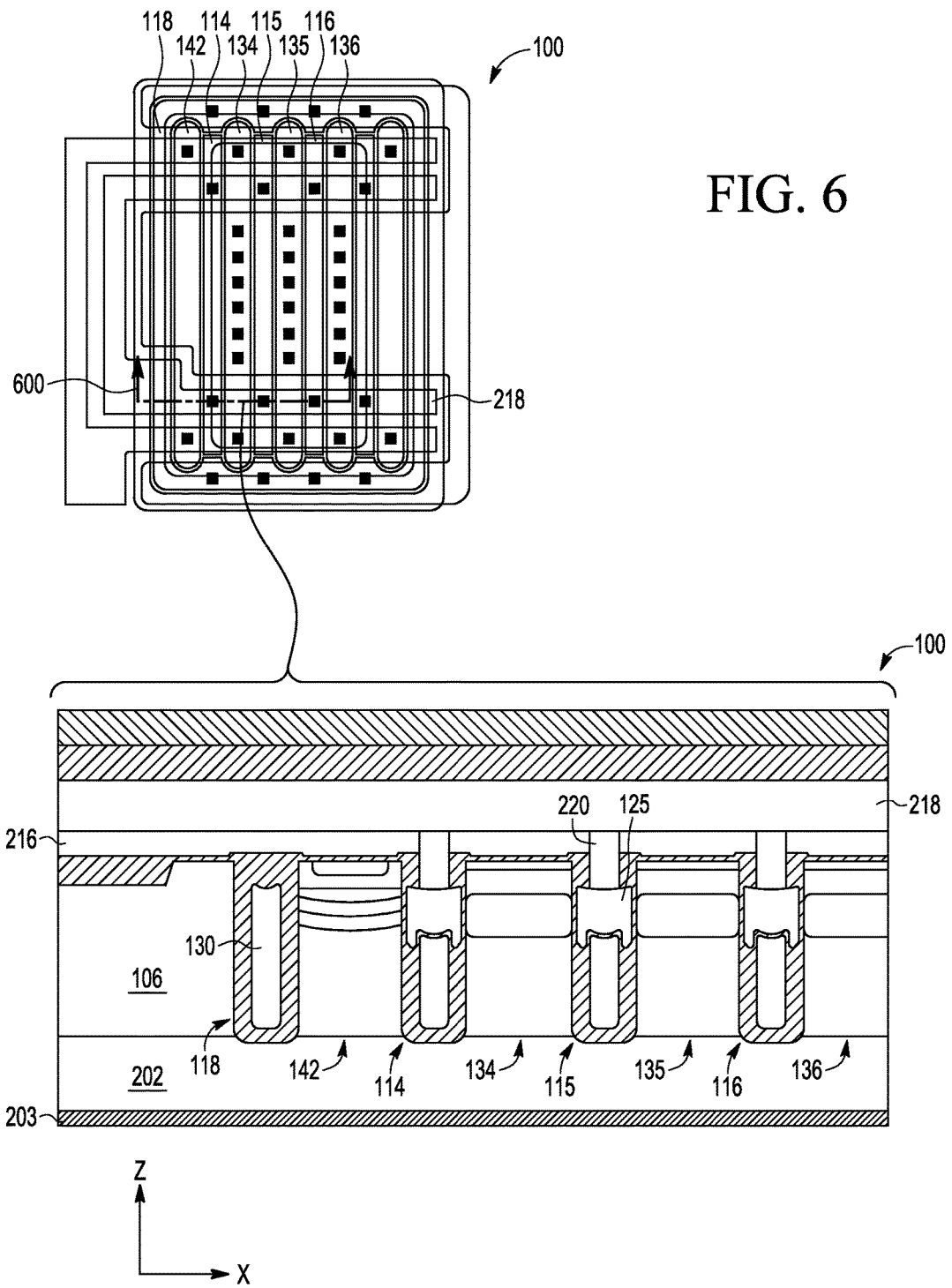
FIG. 6 is a cross-section view of the termination cell and the plurality of active cells below a gate electrode metallization of the semiconductor device of FIG. 1 in accordance with some embodiments.

FIG. 6 illustrates a cross-section view of the semiconductor device 100 along cut line 600 extending across the termination trench 118, the mesas 142, 134, 135, and 136, and the active trenches 114, 115, and 116. As shown, in this cross-section the trench gate electrodes are conductively connected to a portion 218 of the gate terminal electrode 110 via conductive plugs formed in corresponding contact openings, such as the conductive plug 220 connecting the trench gate electrode 125 of the active trench 115 with the metallization forming the node 218.

Figure 7:
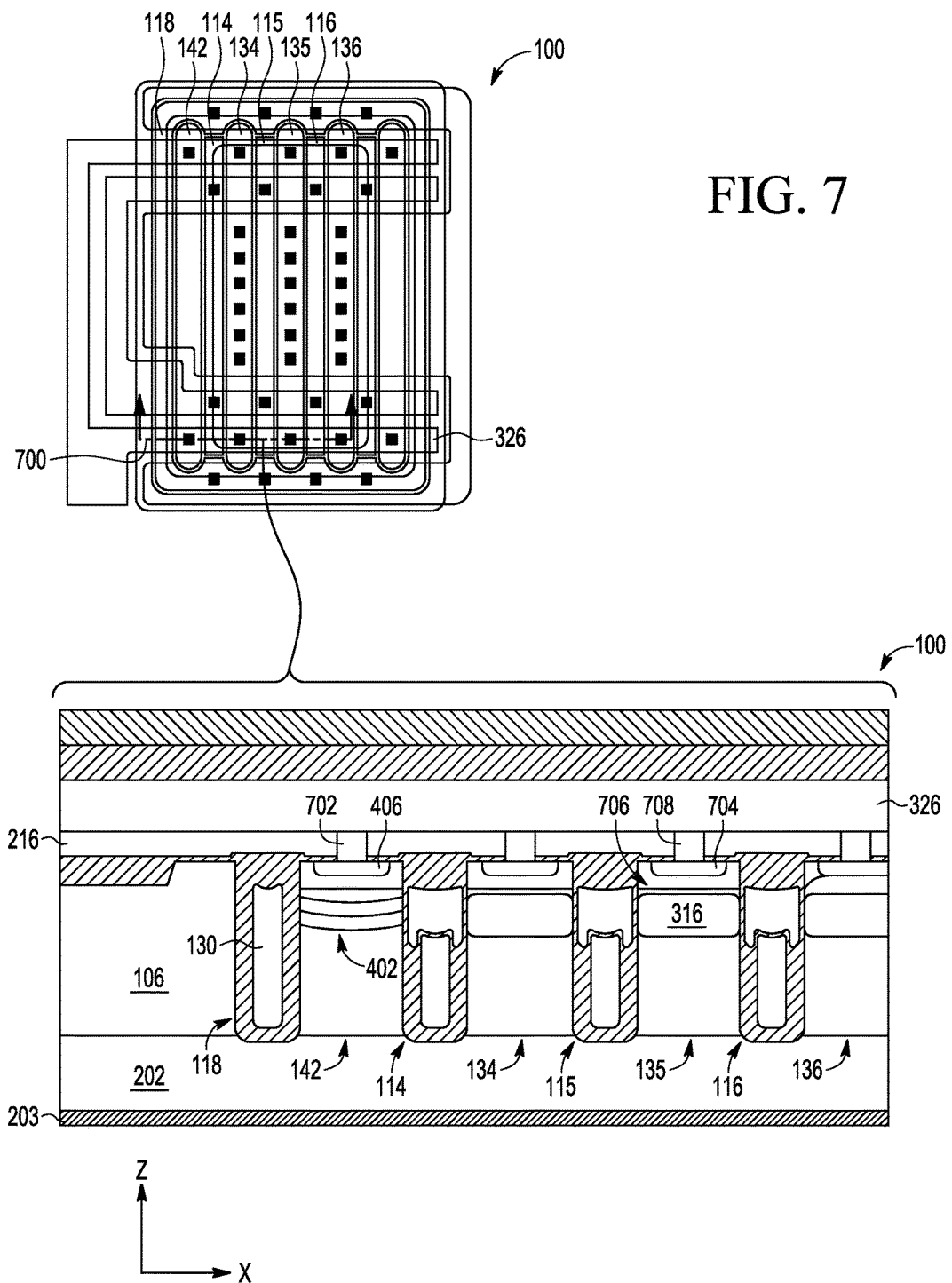
FIG. 7 is a cross-section view of the termination cell and the plurality of active cells below a body electrode metallization of the semiconductor device of FIG. 1 in accordance with some embodiments.

FIG. 7 illustrates a cross-section view of the semiconductor device 100 along cut line 700 extending across a portion of the termination trench 118 transverse to the termination mesa 142 (a sidewall portion of the termination trench), the mesas 142, 134, 135, and 136, and the active trenches 114, 115, and 116. As described above with reference to the cross-section view 500 of FIG. 5, the mesa region 142 includes a body contact region 406 formed in a body link region 402. A conductive plug 702 conductively connects the body contact region 406 and the body link region 402 to a portion 326 of the body terminal electrode 108. Similarly, body link regions and body contact regions are formed in each of the mesa regions 134, 135, and 136, with each body link region extending from the semiconductor surface 206 into the buried body region within the corresponding mesa region, and with each body contact region being conductively connected to the portion 326 of the body terminal electrode 108 via a corresponding conductive plug. For example, the active trench 115 includes a body link region 706 extending from the semiconductor surface 206 into the body region 316 in the mesa region 135 and a body contact region 704 formed therein. The body contact region 704 in turn is connected to a portion 326 of the body terminal electrode 108 using a conductive plug 708 formed in a contact opening in the top dielectric layer 216.

Figure 8:
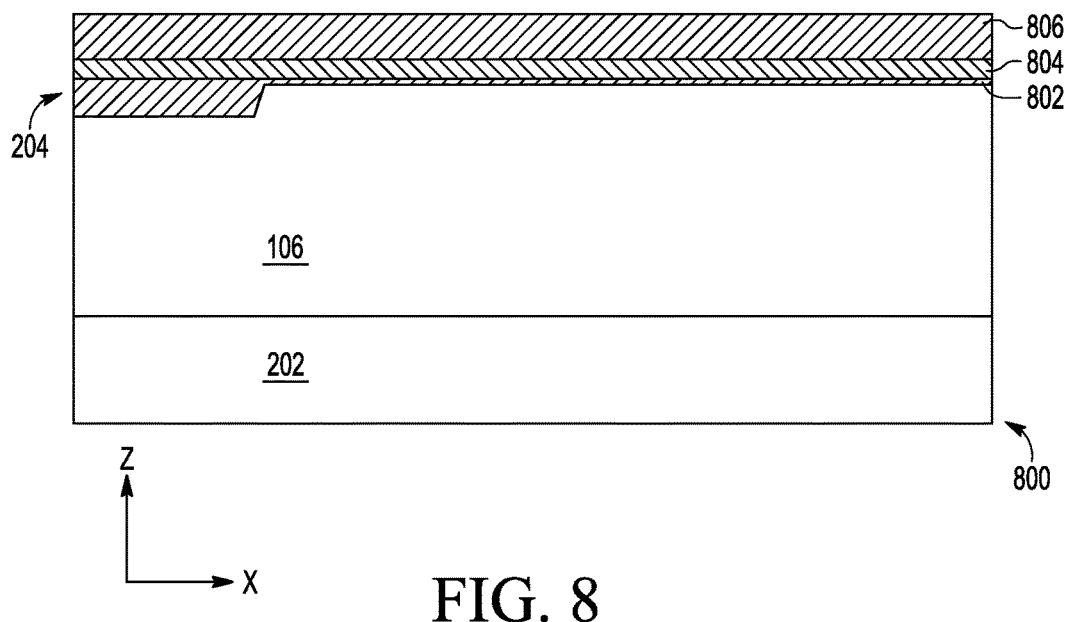
FIG. 8 is a cross-section view of a workpiece during an initial manufacturing stage in accordance with some embodiments.

FIGS. 8-18 together illustrate various manufacturing stages of an example manufacturing process for fabricating the semiconductor device 100 from a workpiece in accordance with at least one embodiment of the present disclosure. FIG. 8 illustrates a cross-section view of a workpiece 800 at a cut line corresponding to cut line 400 of FIG. 4 at an initial manufacturing stage. The workpiece 800 is provided with the epi layer 106 grown or otherwise formed over the substrate 202. The substrate 202 may include, for example, an N++ As doped Si layer with a <100> crystal orientation. The epi layer 106 may include, for example, an N-doped Si layer approximately 5 micrometers (um) thick having arsenic as the dopant at a doping concentration of between 3.5E16-4.5E16 atoms/square centimeter. At the illustrated manufacturing stage, the STI region 204 has been formed and a pad oxide layer 802, a pad nitride layer 804, and a trench hard mask layer 806 have been formed overlying the semiconductor surface 206 using a sequence of growth, deposition, etch, and clean processes.

Figure 9:
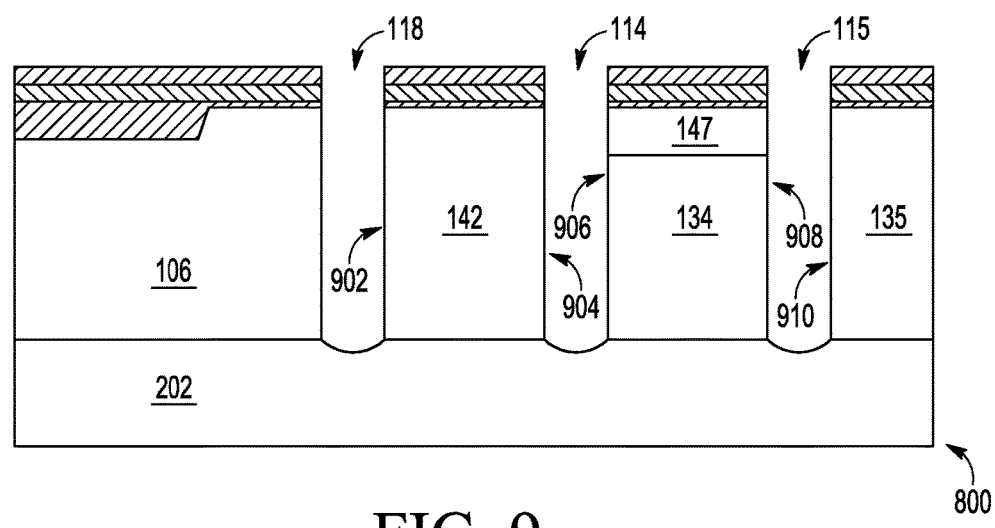
FIG. 9 is a cross-section view of the workpiece after formation of trenches in a semiconductor layer in accordance with some embodiments.

FIG. 9 illustrates a cross-section view of the workpiece 800 at a subsequent manufacturing stage. At this stage, the trenches 118, 114, and 115 have been formed in the epi layer 106 through a series of etch processes. The sidewall 902 of the termination trench 118 and the adjacent sidewall 904 of the active trench 114 define the lateral extent of the mesa region 142. The sidewall 906 of the active trench 114 and the adjacent sidewall 908 of the active trench 115 define the lateral extent of the mesa region 134, which is dimension 147. The sidewall 908 and 910 of the active trench 115 define the lateral extent of the active trench 115, which is dimension 147.

Figure 10:
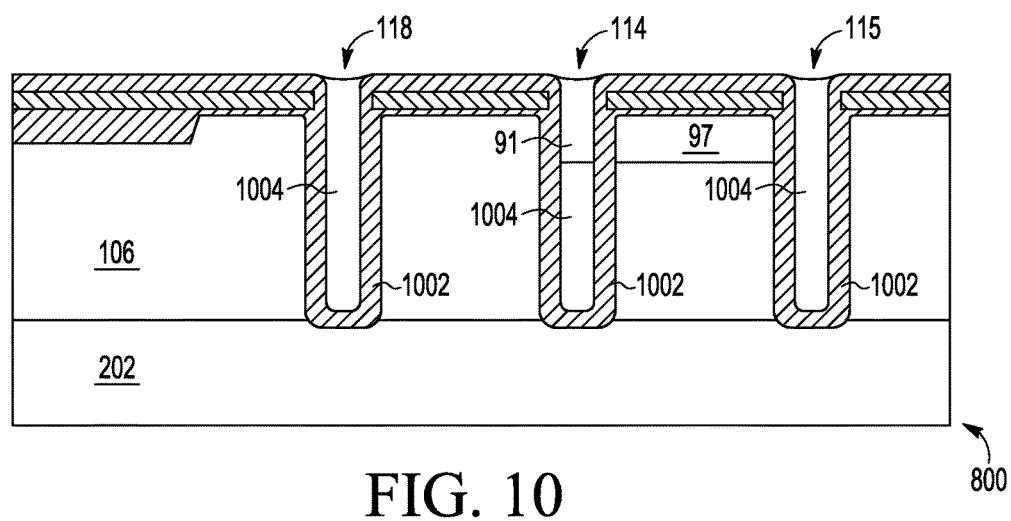
FIG. 10 is a cross-section view of the workpiece after a bottom oxide fill of the trenches in accordance with some embodiments.

As shown by the manufacturing stage represented by FIG. 10, a conformal thick oxide layer 1002 of $SiO_2$ (on the basis of TEOS) or other suitable material has been deposited along the bottoms and sidewalls of the trenches, thereby forming the bottom oxide layers (e.g., bottom oxide layer 210 of FIG. 2) and side oxide layers (e.g., side oxide layers 501 and 503 of FIG. 5. The resulting trenches 118-114, and 115 have a dimension 145' and are then are filed with in-situ doped polysilicon material 1004 above the thick oxide layer 1002, and the polysilicon material 1004 is leveled to the tops of the trenches 118, 114, and 115 through chemical-mechanical planarization (CMP) or another planarization process. Formation of the oxide layer 1002 consumes a portion of the active silicon of the mesa 134, resulting in the transverse extent of the active silicon forming mesa being 97, and the transverse extent of the filled trench 114 being 91.

Figure 11:
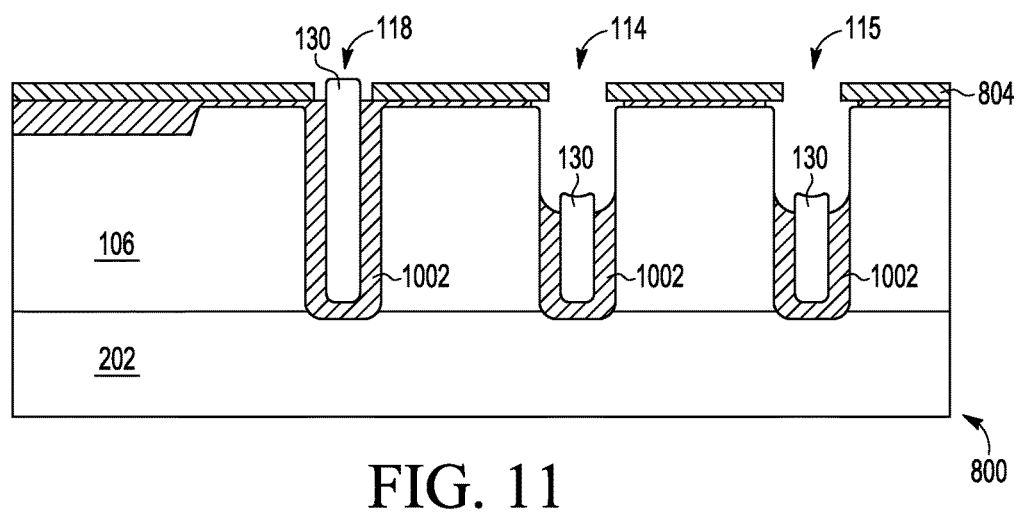
FIG. 11 is a cross-section view of the workpiece after formation of segments of a shield electrode in the trenches in accordance with some embodiments.

At the manufacturing stage represented by FIG. 11, the thick oxide layer 1002 has been etched or otherwise removed where it overlaid the pad nitride layer 804 and both the thick oxide layer 1002 and the polysilicon material 1004 have been partially etched or otherwise partially removed from the active trenches 114 and 115, leaving in each trench a portion of the polysilicon material that will become the corresponding segment of the shield electrode 130 and a portion of the thick oxide layer 1002 to insulate the sides and bottoms of these segments of the shield electrode 130 from the epi layer 106. The portions of the polysilicon material 1004 and the thick oxide layer 1002 formed in the termination trench 118 are maintained through the use of etch masks during the etching of the structures in the active trenches 114 and 115, thereby forming the segment of the shield electrode 130 positioned in the termination trench 118, as previously depicted in FIG. 5.

Figure 12:
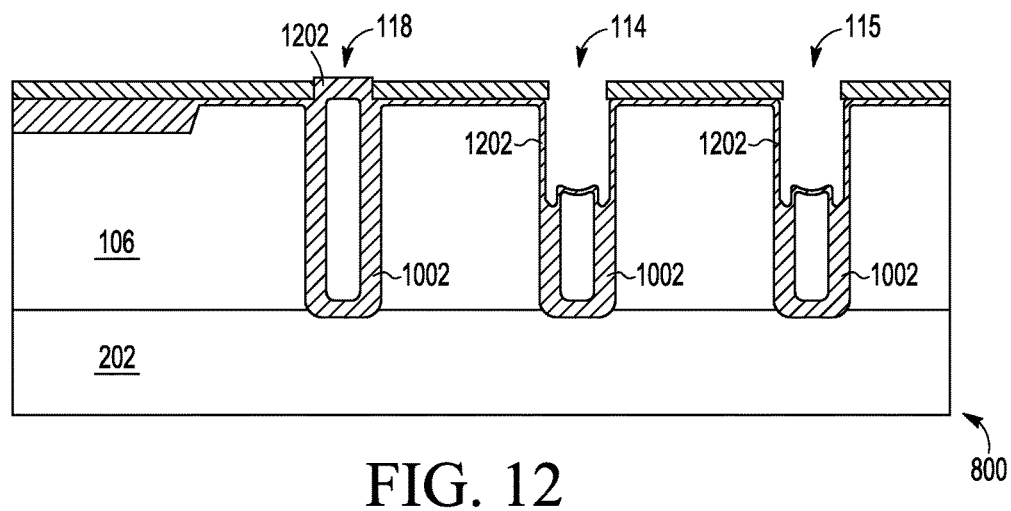
FIG. 12 is a cross-section view of the workpiece after fabrication of an inter-poly dielectric layer in the trenches in accordance with some embodiments.
Figure 13:
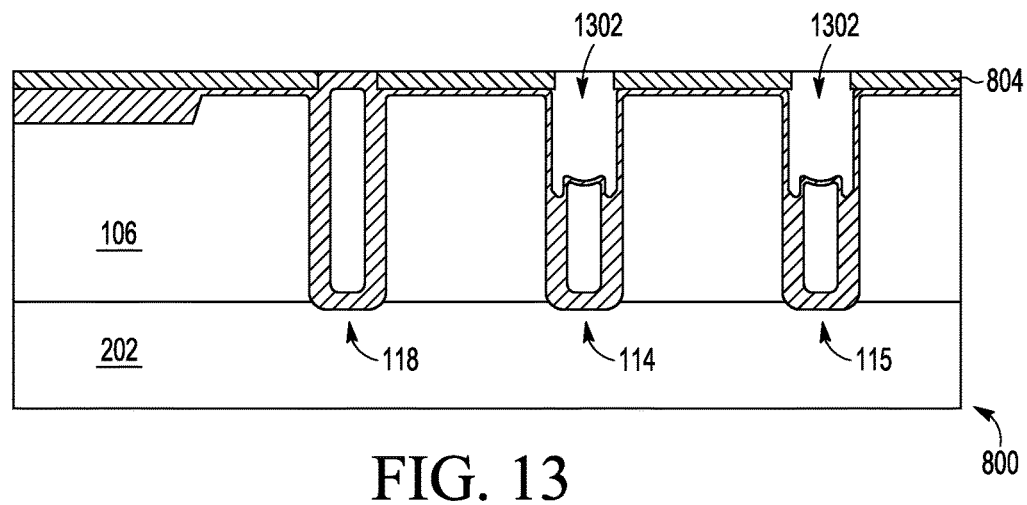
FIG. 13 is a cross-section view of the workpiece after a top oxide fill of the trenches in accordance with some embodiments.

At the manufacturing stage represented by FIG. 12, a thin oxide layer 1202 is grown or otherwise formed in the trenches 118, 114, and 115 over the top surfaces of the shield electrode segments in the trenches 118, 114, and 115 and the remaining oxide, thereby forming the inter-poly dielectric layer 212 (FIG. 2). Formation of the oxide layer 1002 consumes a portion of the active silicon of the mesa 134, resulting in the lateral extent of the active silicon forming mesa being 147". In FIG. 13, the remainder of the trenches 114 and 115 are filed with in-situ doped polysilicon material 1302 and planarized to the surface of the pad nitride layer 804.

Figure 14:
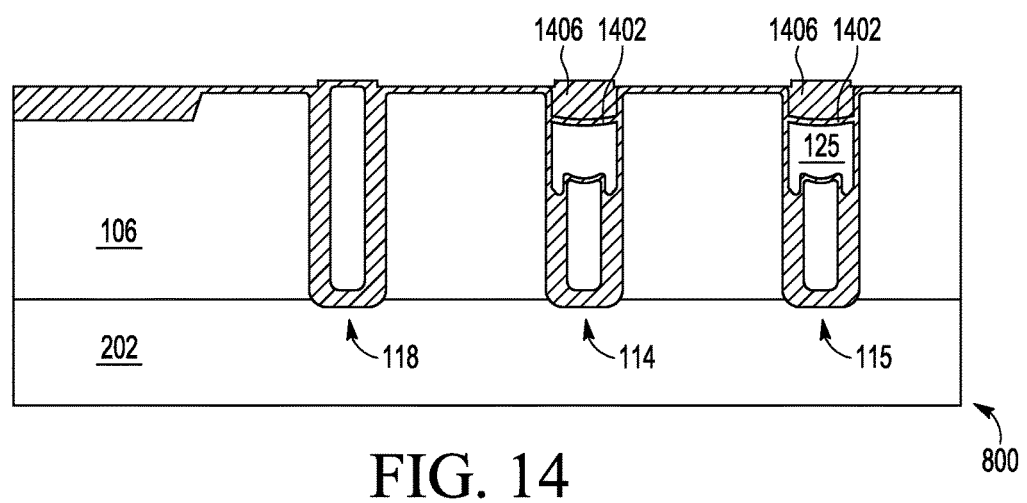
FIG. 14 is a cross-section view of the workpiece after formation of gate electrodes in the trenches in accordance with some embodiments.

At the manufacturing stage represented by FIG. 14, a portion of the polysilicon material 1302 is removed from each of the trenches through an etch process, with the remaining polysilicon material 1302 forming the trench gate electrodes (e.g., trench gate electrode 125) of the trenches 114 and 115. A reoxidation process is performed to form a thin oxide layer 1402 on the top surfaces of the trench gate electrodes, and then a conformal thick layer of $SiO_2$ or other suitable oxide is formed in the remainder of the trenches 114 and 115 and overlying the pad nitride layer 804 (FIG. 13). The oxide layer is planarized to the surface of the pad nitride layer 804 and then the pad nitride layer 804 is stripped from the workpiece 800, leaving thick top oxide layers 1406 above the trench gate electrodes in the trenches 114 and 115, respectively. As one example, the thin oxide layer 1402 may be formed at a thickness of approximately 0.08 um, whereas the thick top oxide layers 1406 may be formed at thicknesses between 0.1-2.0 micrometers (um), and preferably between 0.5 and 1.0 um.

Figure 15:
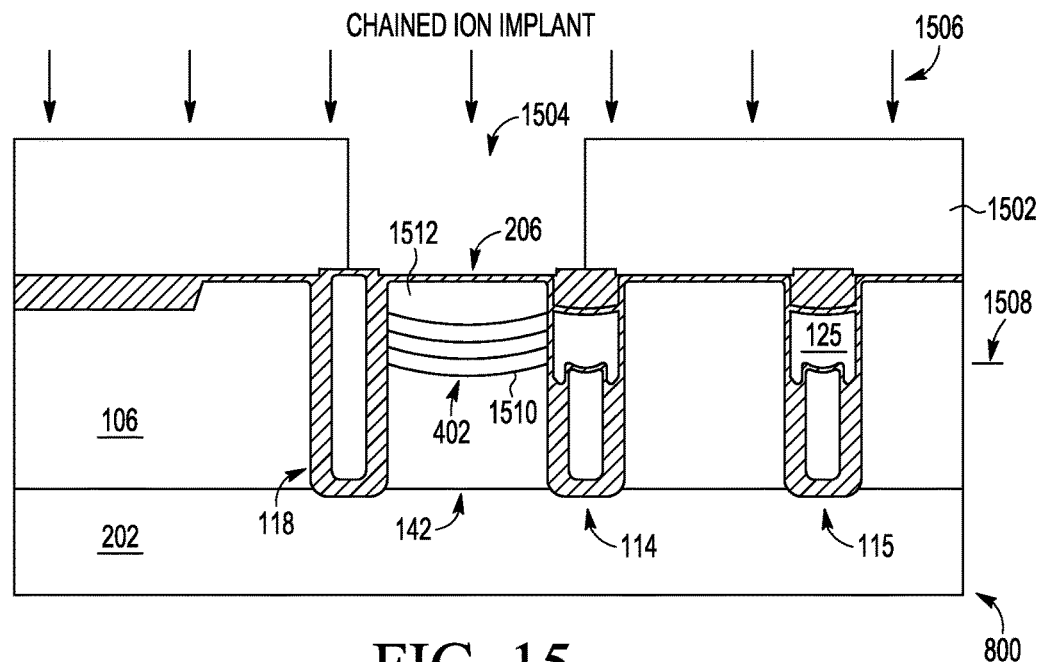
FIG. 15 is a cross-section view of the workpiece during a chained ion implant process for forming a peripheral body link region in accordance with some embodiments.

FIG. 15 illustrates a manufacturing stage for formation of the body link region 402 in the mesa region 142. To protect areas of the workpiece 800 not intended for implantation, an implant mask layer 1502 included of photoresist or other suitable material is deposited or otherwise formed overlying the semiconductor surface 206 and an opening 1504 in the implant mask layer 1502 is formed in the area overlying the mesa region 142. In at least one embodiment, the body link region 402 and other body link regions of the workpiece 800 are formed through a chained ion implant process 1506 in which a series of ion implants at different implant energies are performed to form a chain of overlapping P-doped regions extending from the semiconductor surface 206 to a depth 1508 in the N-doped epi layer 106. To illustrate, the chained implant process 1506 includes an ion implant using boron at a dose of approximately 2.0E14 atoms per square centimeter ("sq. cm") at an implant energy of approximately 320 keV to form a bottom doped region 1510 extending to the depth 1508 followed by an ion implant using boron at a dose of approximately 2.0E15 atoms per sq. cm at an implant energy of approximately 80 keV to form a top doped region 1512 extending from the semiconductor surface 206 and overlapping with an upper extent of the bottom doped region 1510. In other embodiments, the chain implant process 1506 may implement a series of three or more ion implants, and the series may sequence from higher implant energy to lower implant energy, or vice versa, or any order of different implant energies. As noted, the other body link regions, such as the body link region 325 of FIG. 3, may be formed from the same chained ion implant process 1506 or from one or more similar chained ion implant processes.

Figure 16:
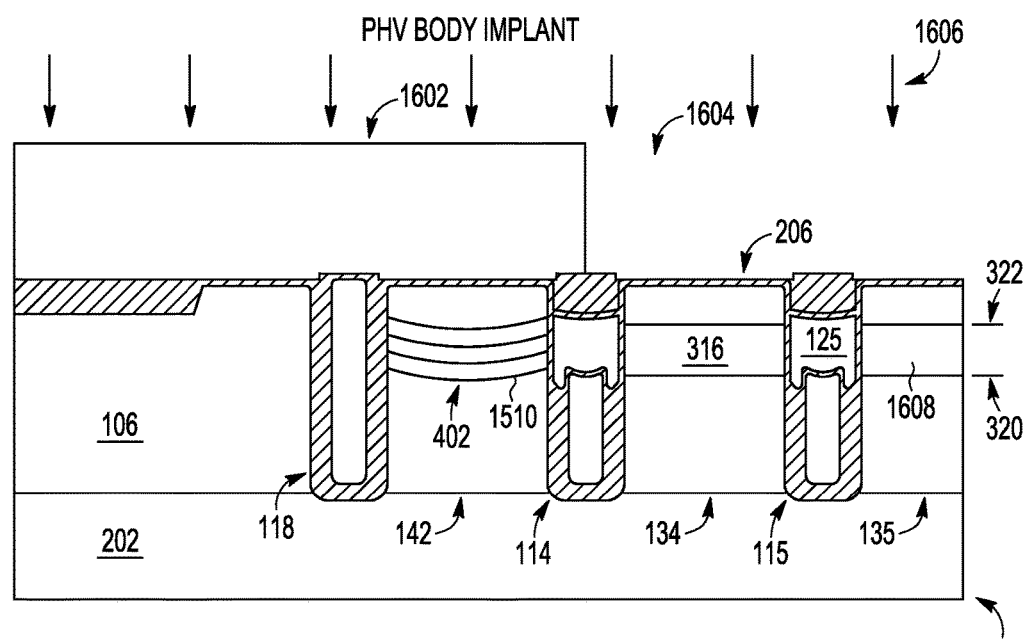
FIG. 16 is a cross-section view of the workpiece during a high-voltage ion implant process for forming buried body regions between the trenches in accordance with some embodiments.

FIG. 16 illustrates a manufacturing stage for formation of the body regions in the mesa regions 134 and 135. To protect perimeter areas of the workpiece 800 not intended for implantation at this stage, an implant mask layer 1602 included of photoresist or other suitable material is deposited or otherwise formed overlying the semiconductor surface 206 and an opening 1604 in the implant mask layer 1502 is formed in the area overlying the inner cells. A P-type high voltage (PHV) implant process 1606 then is performed to form the buried body region 316 in the mesa region 134 and a buried body region 1608 in the mesa region 135. A blanket PHV implant process may be implemented at this stage due to the screen oxide function provided by the thick top oxide layers formed at the tops of the trenches in the inner cells. To illustrate, the PHV implant process 1606 may include a P-type blanked implant using boron at a dose of approximately 2.0E13 atoms per sq. cm at an implant energy between 750 and 950 keV, and preferably at about 850 keV, to form the buried body regions 316 and 1608 between depths 320 and 321 below the semiconductor surface 206. The PHV implant process 1606 may be followed by, for example, a furnace anneal process at, for example, at a temperature of 1050 degrees centigrade to redistribute the dopants of the body regions and body link regions of the workpiece 800.

Figure 17:
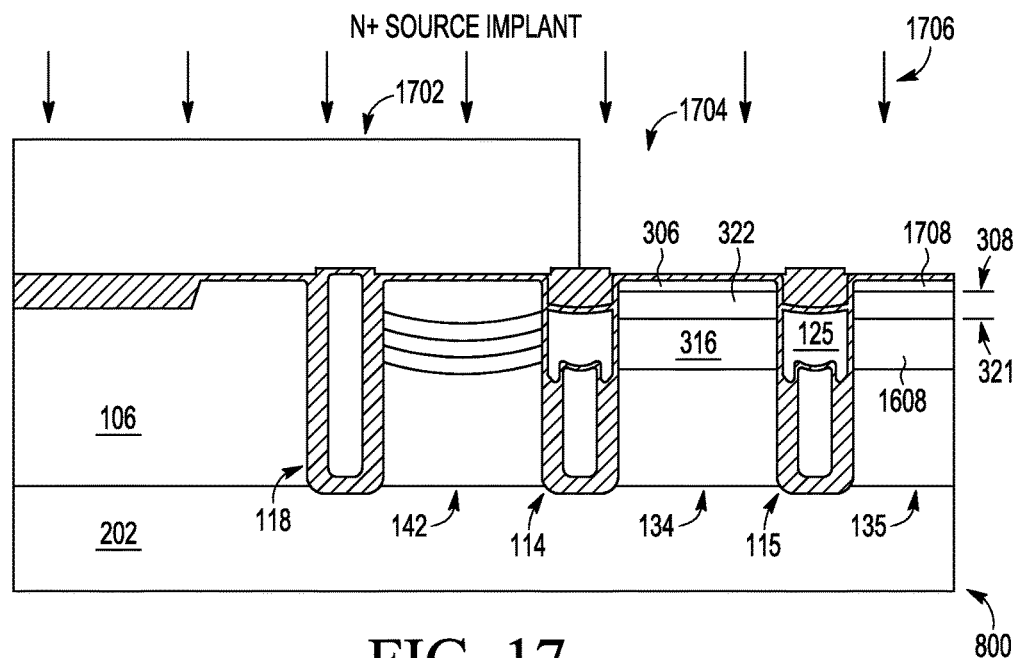
FIG. 17 is a cross-section view of the workpiece during an ion implant process for forming self-aligned source contact regions above the buried body regions in accordance with some embodiments.

FIG. 17 illustrates a manufacturing stage for formation of the source regions in the mesa regions 134 and 135 of the workpiece 800. To protect perimeter areas of the workpiece 800 not intended for implantation at this stage, an implant mask layer 1702 included of photoresist or other suitable material is deposited or otherwise formed overlying the semiconductor surface 206 and an opening 1704 in the implant mask layer 1702 is formed in the area overlying the inner cells. An N+ implant process 1706 then is performed to form the source contact region 306 above the body region 316 in the mesa region 134 and to form a source contact region 1708 above the body region 1608 in the mesa region 135. The N+ implant process 1706 may be followed by a furnace anneal process at a temperature of, for example, 900 degrees centigrade to redistribute the dopants of the source contact regions of the workpiece 800.

As with the PHV implant process 1606, the N+ implant process 1706 may be performed as a blanket implant process for the inner cell region due to the implant protection afforded by the thick oxide layers (acting in effect as screen oxide layers) at the tops of the trenches in the inner cell region. To illustrate, the N+ implant process 1706 may include a blanket N-type implant using arsenic (As) at a dose of approximately 6.0E15 atoms per sq. cm an implant energy between 50 and 100 keV, and preferably at about 80 keV. The source contact regions 306 and 1708 extend approximately to a depth 308 that is shallower than the upper depth 321 of the body regions 316 and 1608, and thus the source contact region 306 is separated from the body region 316 by a region 322 of the epi layer 106 and the source contact region 1708 is separated from the body region 1608 by a region 1710 of the epi layer 160. Moreover, the resulting source contact regions extend fully between the sidewalls of the adjacent trenches that define the mesa region in which the source contact region is formed. As such, the N+ implant process 1706, in combination with the particular structure of the workpiece 800, provide for self-aligned source contact regions.

Figure 18:
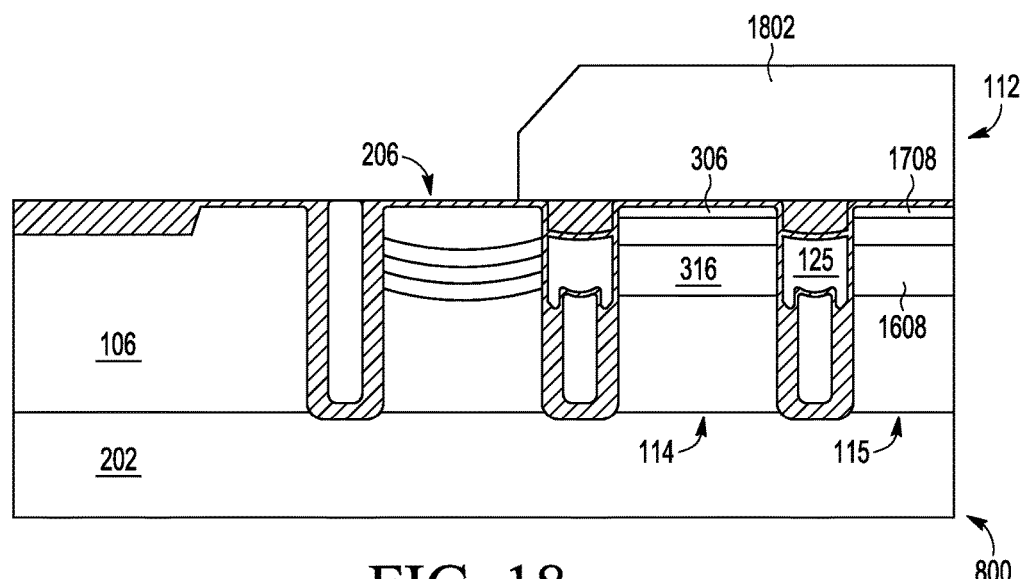
FIG. 18 is a cross-section view of the workpiece after formation of a source electrode metallization in accordance with some embodiments.

FIG. 18 illustrates a manufacturing stage for formation of the source metallization for the source/shield terminal electrode 112 at the workpiece 800. As described above with reference to FIG. 17, the source contact regions of the mesa regions of the inner cells are formed at the semiconductor surface 206 using a blanket N+ implant process that self-aligns the source contact regions with respect to the adjacent trenches, while the trenches of the inner cells remain isolated from the semiconductor surface 206 due to the thick oxide layers overlying the trench gate electrodes in the trenches. As such, in at least one embodiment the metal or other conductive material 1802 (e.g., one or more layers of Ti, TiN, and AlCuW) of the source/shield terminal electrode 112 may be deposited directly on the semiconductor surface 206 of the workpiece 800 and then etched or otherwise formed into a specified pattern for the source/shield terminal electrode 112, such as the example pattern for the source/shield terminal electrode 112 shown in FIG. 1. This places the conductive material 1802 of the source/shield terminal electrode 112 into direct conductive contact with the source contact regions 306 and 1708 of mesa regions 134 and 135, respectively, as well as other source contact regions of the mesa regions of the inner cells, and thus eliminates the need for a contact mask to form the source contact layers in an intervening dielectric layer overlying the source contact regions.

Figure 19:
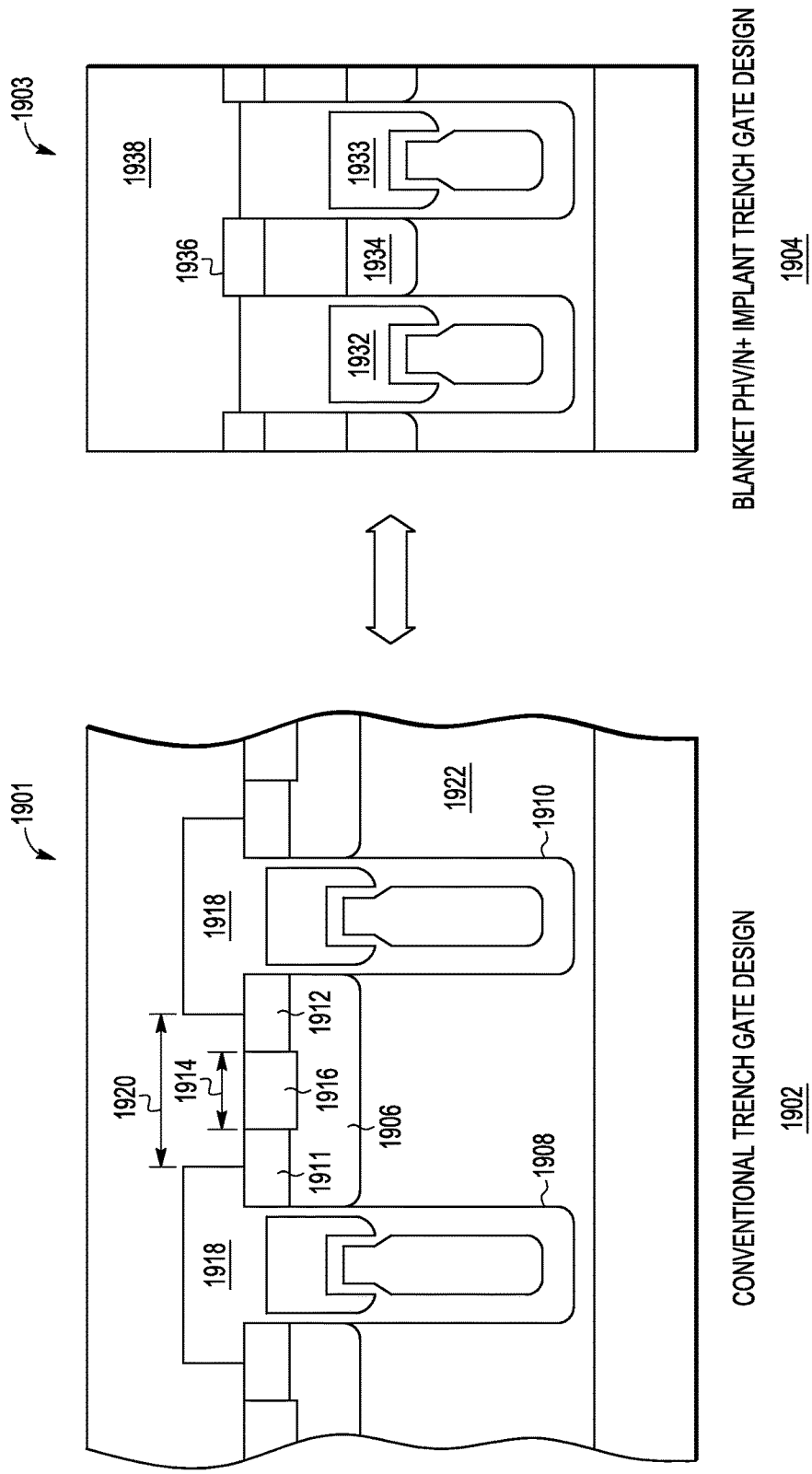
FIG. 19 is a cross-section view of a semiconductor device having cells with self-aligned source metal contacts in accordance with some embodiments.

FIG. 19 illustrates a side-by-side comparison of a cross-section view 1902 of a conventional trench gate FET 1901 and a cross-section view 1904 of a trench gate FET 1903 fabricated in accordance with the techniques described above. As illustrated by cross-section view 1902, in the conventional trench gate FET 1901 a P− body region is formed in the mesa region between two adjacent trenches 1908 and 1910, and two N+ regions 1911 and 1912 are formed using an N+ implant and an N+ block mask (not shown) to protect the illustrated region 1914 from implantation. A P+ region 1916 then is formed using a P+ implant and a P+ block mask 1918 composed of $SiO_2$ to protect gate electrodes in the trenches 1908 and 1910 and the N+ regions 1911 and 1912 from the P+ implant. A contact mask (not shown) is used to etch a contact opening 1920 in the P+ block mask 1918 to form a source contact that extends from the surface of the epi layer 1922 to the source metal 1924. Thus, under this approach, the silicon width Sx of the conventional trench gate FET 1901 (that is, the width between trenches) is constrained by the photolithography design rules for the N+ implant mask and the contact mask used to protect the P+ region 1916 and to form the contact opening 1920.

In contrast, the fabrication process for the trench gate FET 1903 described above does not require an N+ implant mask or a contact mask. Rather, as described above, the use of thick oxide layers overlying the tops of the trenched gate electrodes (e.g., thick oxide layers 1930 and 1931 overlying trench gate electrodes 1932 and 1933, respectively) and the use of buried body regions (such as buried body region 1934) permits the doping of the mesa regions in the inner cell region to occur without masks in the inner cell region. This ability to avoid the use of such masks permits the formation of a self-aligned source contact regions (e.g., source contact region 1936) and a source electrode metallization 1938 that may directly overlie the source contact regions. As the N+ implant mask and contact mask are not used, the silicon width Sx of the trench gate FET 1903 is not limited by the design rules limited by such masks, and thus the silicon width Sx between trenches may be considerably narrower than that possible in the conventional trench gate FET 1901. The reduced silicon width achievable using the fabrication techniques described herein permits the trench gate FET 1903 to exhibit a significantly enhanced RESURF effect, and thus exhibit a lower $R_{DSon}$ for a given $BV_{dss}$.

One primary factor the in the performance of a trench gate FET is the effectiveness of the edge termination structure used in the trench gate FET to control the electric field at the edges of the device. Conventional edge termination structures, such as field plates or field rings, often provide effective edge termination. However, the formation of such edge termination structures often requires a considerable number of processing steps, as well as a considerable portion of the device floor plan to implement. Moreover, the thick trench sidewall oxide and deep trenches employed in the trench gate FET designs described above often render field plates and field rings less effective as edge termination structures. FIGS. 20-23 illustrate techniques for fabricating edge termination structures that provide effective edge termination for the trench gate FET designs described above while requiring few, if any, additional processing steps.

Embodiments of the trench gate FET designs described above employ P-type body regions buried at non-zero depths below the surfaces of mesa regions of the epi layer in which the inner cells are formed. The breakdown voltage $BV_{dss}$ of the inner cell is based in part on the thickness of the region of the epi layer below the buried body region, which in turn defines the RESURF area or depletion region for the cell. The thicker this region, the higher the $BV_{dss}$, and vice versa. As an effective edge termination structure provides a higher $BV_{dss}$ than the $B_{Vdss}$ of the inner cells, in at least one embodiment the trench gate FET 102 leverages this relationship between buried body region depth and $BV_{dss}$ by providing one or more termination cells at the edges of the trench gate FET 102 with a body region formed at a shallower depth than the depth of the buried body regions of the inner cells. With this configuration, the termination cells exhibit a higher $BV_{dss}$ than the inner cells, and thus provide effective electric field dissipation at the edge of the trench gate FET 102.

Figure 20:
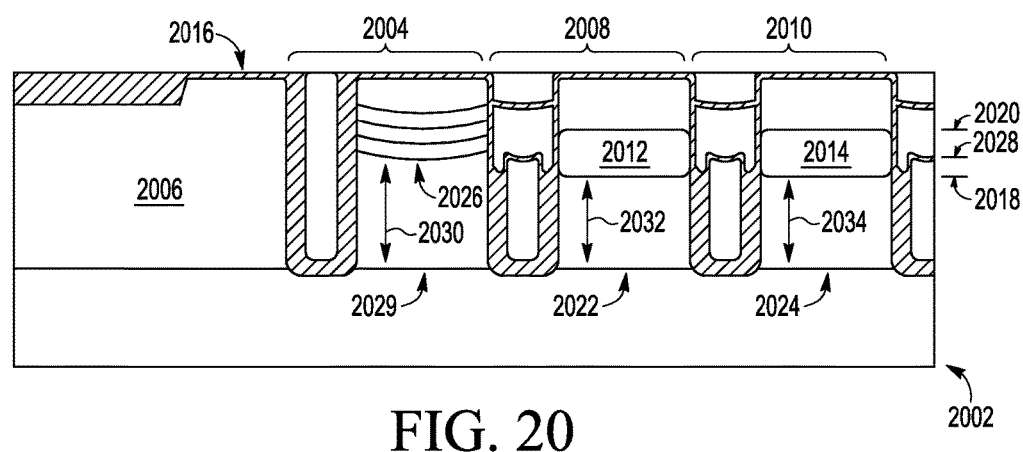
FIG. 20 is a cross-section view of a semiconductor device including a termination cell having a shield trench and a mesa region with a shallow body link region in accordance with some embodiments.

The shallower body region formed in the termination cells may be formed using any of a variety of techniques. FIG. 20 illustrates one example approach using a body link region in the termination cells. In the depicted cross-section view of a trench gate FET 2002 (one embodiment of the trench gate FET 102), a termination cell 2004 is formed at the edge of an array of active cells, including active cells 2008 and 2010. The active cells 2008 and 2010 include buried body regions 2012 and 2014, respectively, formed beneath a surface 2016 of an epi layer 2006 in which the cells 2004, 2008, and 2010 are formed. In the depicted example, the buried body regions 2012 and 2014 extend between a lower depth 2018 and an upper depth 2020 in mesa regions 2022 and 2024, respectively, of the epi layer 2006. The termination cell 2004 includes a body link region 2026 formed in a mesa region 2029 of the epi layer 2006. The body link region 2026 extends from the surface 2016 to a depth 2028 in the epi layer 2006, where the depth 2028 is less than the depth 2018. As illustrated by FIG. 3 above, the body link region 2026 may be conductively connected to the body terminal electrode 108 via a P+ body contact and a conductive plug. In this configuration, the thickness 2030 of the epi layer 2006 in the region underneath the body link region 2026 is greater than the thicknesses 2032 and 2034 of the epi layer 2006 in the regions underneath the buried body regions 2012 and 2014, respectively. As such, the termination cell 2004 exhibits a greater $BV_{dss}$ than that of the inner cells 2008 and 2010.

FIGS. 21-23 illustrate an example process for forming the body link region 2026 in the termination cell 2004 of the trench gate FET 2002 of FIG. 20 in accordance with at least one embodiment. At the manufacturing stage represented by cross-section view 2102 of FIG. 21, the inner cells 2008 and 2010 have been formed with their corresponding buried body regions 2012 and 2014, respectively, in a workpiece 2100 and a termination trench 2108 has been formed for the termination cell 2004. In this example, the buried body regions 2012 and 2014 are formed through a PHV implant using Boron at an implant energy of 850 keV.

An implant mask layer 2110 composed of photoresist or other suitable material is deposited or otherwise formed at the surface 2016 of the epi layer 2006. An opening 2112 aligned with the mesa region 2029 is etched or otherwise formed in the implant mask layer 2110. With the opening 2112 in the implant mask layer 2110 so formed, the workpiece 2100 is subjected to a chained implant process to form the body link region 2026. In the depicted example of FIG. 21, the chained implant process is implemented as a series of three implants at decreasing implant energies. However, the chained implant process is not limited to this example, and instead may utilize a series of two implants, or a series of four or more implants, and the implant energies may increase through process, decrease through the process, or occur in any other order.

As illustrated by cross-section view 2102 of FIG. 22, the chained implant process begins with an initial Plink implant process 2103, referred to herein as a Plink process, using Boron as the dopant at an implant energy of, for example, between 400 and 600 keV, and preferably 500 keV, which forms a body region 2114 at a depth 2116 below the surface 2016, and extending to the depth 2028. As illustrated by cross-section view 2104, in the next stage of the chained implant process, a Plink implant process 2105 is performed using Boron as the dopant at an implant energy of, for example, between 200 and 400 keV, and preferably 300 keV, thereby forming a body region 2118 at a depth 2120 below the surface 2016, and which overlaps with the body region 2114. As illustrated by cross-section view 2106, in a final stage of the chained implant process of this example a Plink implant process 2107 is performed using Boron as the dopant at an implant energy of, for example, between 50 and 150 keV, and preferably 100 keV, thereby forming a body region 2122 that extends from the surface 2016 to a depth 2124 below the depth 2120. The resulting three overlapping body regions 2114, 2118, and 2122 together form the body link region 2026, which extends from the surface 2016 to the depth 2028, which is significantly shallower than the depth 2018 reached by the buried body regions 2012 and 2014 of the inner cells 2008 and 2010.

In at least one embodiment, the body link region 2026 is formed using the same implant mask and chained implant process used to form the other body link regions of the trench gate FET, such as the body link region 325 formed in the mesa region 135 (see FIG. 3) and the body link region 402 formed in the mesa region 142 (see FIG. 4). That is, the implant mask layer 2110 may include the same implant mask used to form these other body link regions. In such instances, implementation of the body link region 2026 does not require additional mask work or separate implant processes and thus contributes to effective edge termination without additional fabrication steps.

Figure 24:
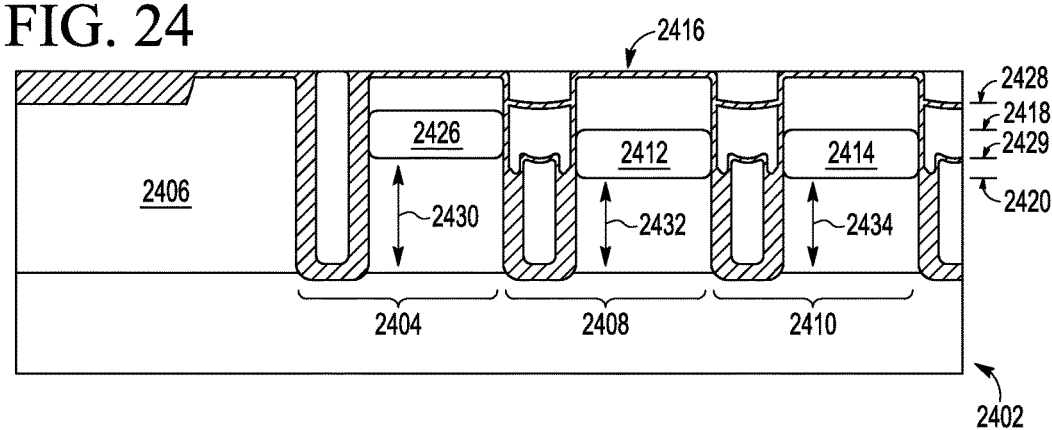
FIG. 24 is a cross-section view of a semiconductor device including a termination cell having a shield trench and a mesa region with a shallow buried region in accordance with some embodiments.

FIG. 24 illustrates another example approach for using a shallow body region in the termination cells for effective edge termination. In this approach, rather than using a body link region in the termination cell, a buried body region is formed in the termination cell at a lower implant energy than the buried body regions formed in the inner cells, thereby placing the buried body region in the termination cell at a shallower depth than the buried body regions in the inner cells. To illustrate, in the depicted cross-section view of a trench gate FET 2402 (one embodiment of the trench gate FET 102), a Plink implant at a higher implant energy (e.g., 850 keV) is performed to form buried body regions 2412 and 2414 in the mesa regions of active cells 2408 and 2410, respectively. The buried body regions 2412 and 2414 extend between upper depth 2418 and lower depth 2420 below a surface 2416 of an epi layer 2406 in which the cells are formed. Another Plink implant at a lower implant energy (e.g., 500 keV) is performed to form a buried body region 2426 in a mesa region of a termination cell 2404 at the edge of an array of active cells. With this lower implant energy, the buried body region 2426 extends between an upper depth 2428 (shallower than the upper depth 2418) and a lower depth 2429 (shallower than the lower depth 2420). The buried body region 2426 is then connected to the body terminal electrode 108 using a body link region and body contact region as described in detail above. In this configuration, the thickness 2430 of the region of the epi layer 2406 underneath the buried body region 2426 is greater than the thicknesses 2032 and 2034 of regions of the epi layer 2406 underneath the buried body regions 2412 and 2414, respectively. As such, the termination cell 2404 exhibits a higher $BV_{dss}$ than the inner cells 2408 and 2410.

Figure 25:
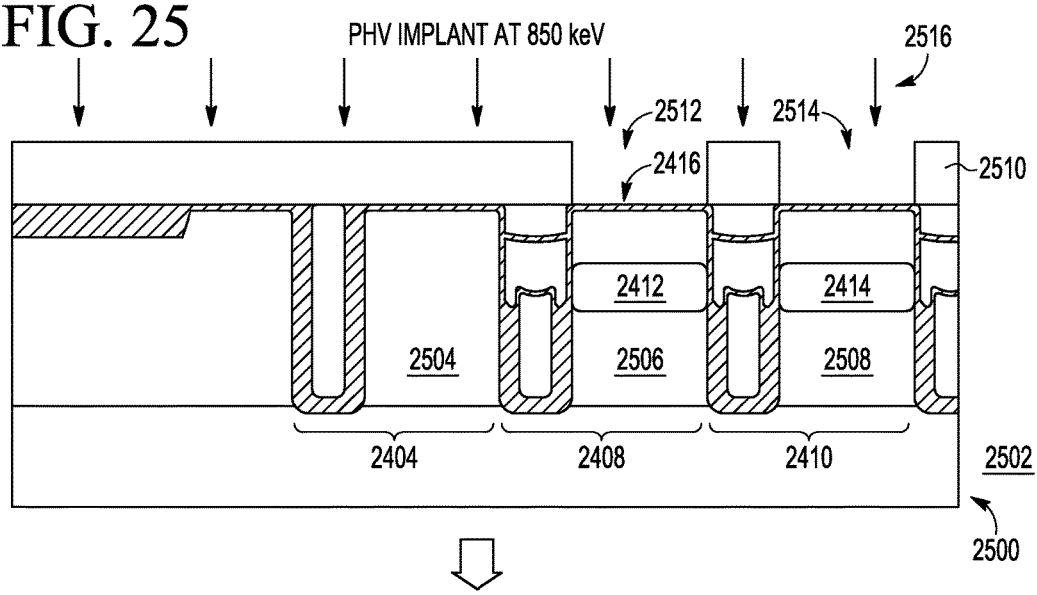
FIG. 25 illustrates a cross-section view of a workpiece during two separate high-voltage ion implant processes to form the semiconductor device of FIG. 24 in accordance with some embodiments.
Figure 26:
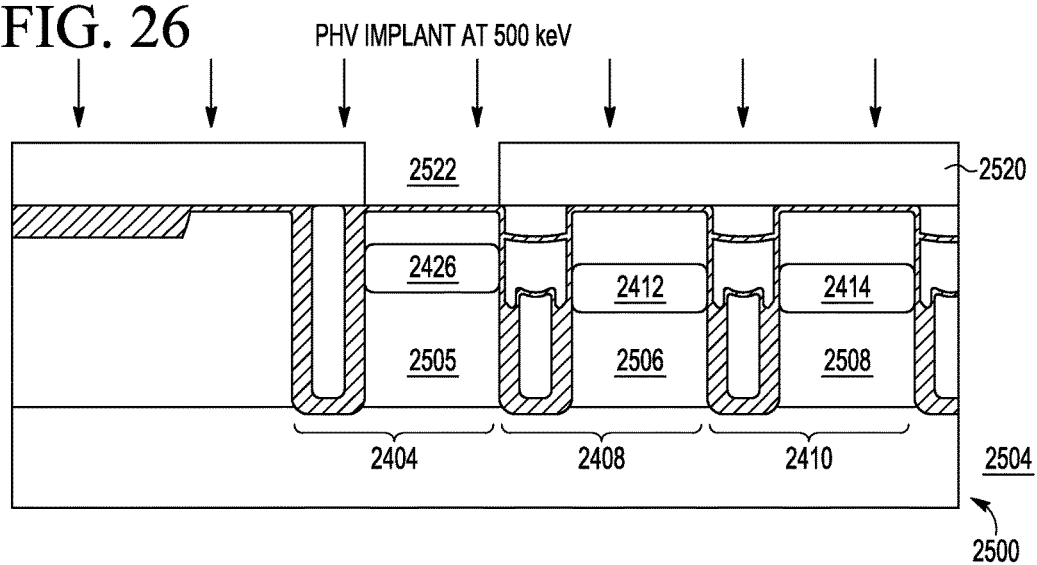
FIG. 26 illustrates another cross-section view of the workpiece of FIG. 25 during the two separate high-voltage ion implant processes to form the semiconductor device of FIG. 24 in accordance with some embodiments.

FIGS. 25 and 26 illustrate an example process for forming the body region 2426 in the termination cell 2404 of the trench gate FET 2402 of FIG. 24 in accordance with at least one embodiment. At the manufacturing stage represented by cross-section view 2502 of FIG. 25, a workpiece 2500 has been formed with termination trenches and active trenches defining mesa regions 2505, 2506, and 2508 for the termination cell 2404, the inner cell 2408, and the inner cell 2410, respectively. An implant mask layer 2510 composed of photoresist or other suitable material is formed overlying the surface 2416 and then openings 2512 and 2514 aligned with the mesa regions 2506 and 2508, respectively, are etched or otherwise formed in the implant mask layer 2310. A PHV implant 2516 is performed using Boron as the dopant at an implant energy of between 700 and 900 keV, and preferably 850 keV, to form the buried body regions 2412 and 2414.

At the manufacturing stage represented by cross-section view 2504 of FIG. 26, the implant mask layer 2510 has been stripped or otherwise removed from the workpiece 2300 and another implant mask layer 2520 is formed overlying the surface 2416. An opening 2522 aligned with the mesa region 2505 of the termination cell 2204 is etched or otherwise formed, and then a second Plink implant 2524 is performed using Boron as a dopant at an implant energy of between 400 and 600 keV, and preferably 500 keV, to form the buried body region 2226 in the mesa region 2505 of the termination cell 2204.

Figure 27:
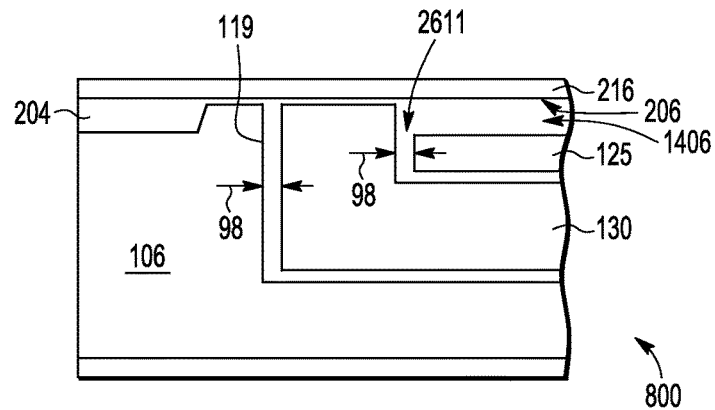
FIG. 27 illustrates a cross-section of the workpiece at the location 200 of FIG. 2 during manufacturing of the workpiece prior to formation of the features illustrated at FIG. 2.

FIG. 27 illustrates a cross-section view of a workpiece 800 along a cut line corresponding to cut line 200 of FIG. 2 at a manufacturing stage after formation of the shield electrode 130, the trench gate electrodes 125, the top dielectric layer 1406, and an inter-level dielectric layer 216. The dielectric 2611 between the shield electrode 130 and the outer perimeter 119 of termination trench 118 is dimension 98 at a location near the surface of the workpiece 800. The same or different dielectric 2611 has dimension 98 in the lateral direction between the gate 125 and shield dielectric 130.

Figure 28:
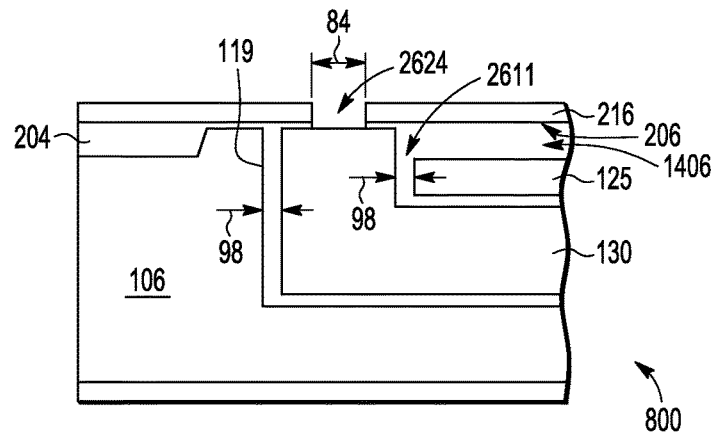
FIG. 28 illustrates a cross-section of the workpiece of FIG. 27 during manufacturing of the workpiece prior to formation of the features illustrated at FIG. 2.

At FIG. 28, contact opening 2624 having a lateral dimension 84 has been formed to expose a contact location of the shield 130, such as through the use of an etch mask followed by an etch process that selectively etches dielectric material as opposed to the polysilicon material from which the shield layer 130 and gate layer 125 (not shown) are formed. According to an embodiment, a contact opening exposing the gate electrode 125 (not shown) can be formed at the same time as the contact opening 2624.

Figure 29:
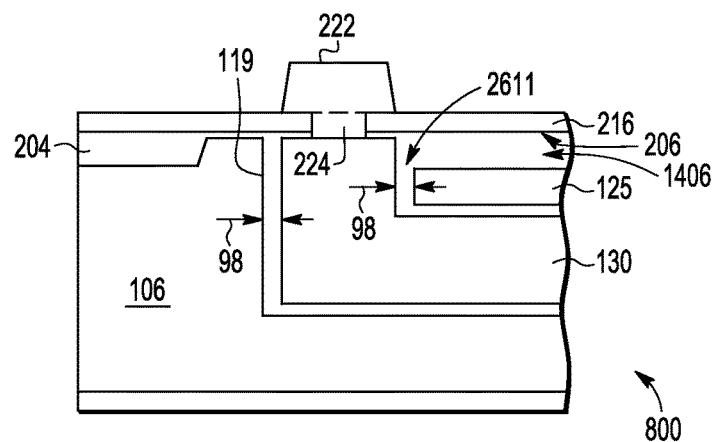
FIG. 29 illustrates a cross-section of the workpiece ate FIG. 28 during manufacturing of the workpiece prior to formation of the features illustrated at FIG. 2.

FIG. 29 illustrates the workpiece 800 after formation of a conductive plug 224 at the opening 2624 and of a source/shield terminal electrode 222 that is in electrical contact with the conductive plug. It will be appreciated, that the conductive plug 224 can be formed contemporaneously with the source/shield termination electrode 222, such as with a dual Damascene process, or can be formed prior to the source/shield termination electrode.

In order to improve manufacturability of the device 100, it is desirable for trench regions to have the same spacing during the etch process that forms the trench regions. While the transverse spacing between the mesas is typically fixed in previously known devices, the spacing between the outer perimeter of the trench has been larger than the transverse spacing between mesas in order to accommodate shield electrode formation. Alternatively, the spacing between mesas has been selected to be large in order to accommodate formation of shield contacts between the mesa pairs of the array. Formation of shield conductive plugs between the mesas results in a larger device size by requiring a larger transverse space between mesas in order to meet various design rules. In accordance with a specific embodiment of the present disclosure, the transverse spacing between the mesas, and the lateral spacing between each mesa and the outer perimeter of the trench, is substantially the same. In addition, a plurality of shield contacts are formed in the termination area, as will be better understood in reference to FIG. 30.

Figure 30:
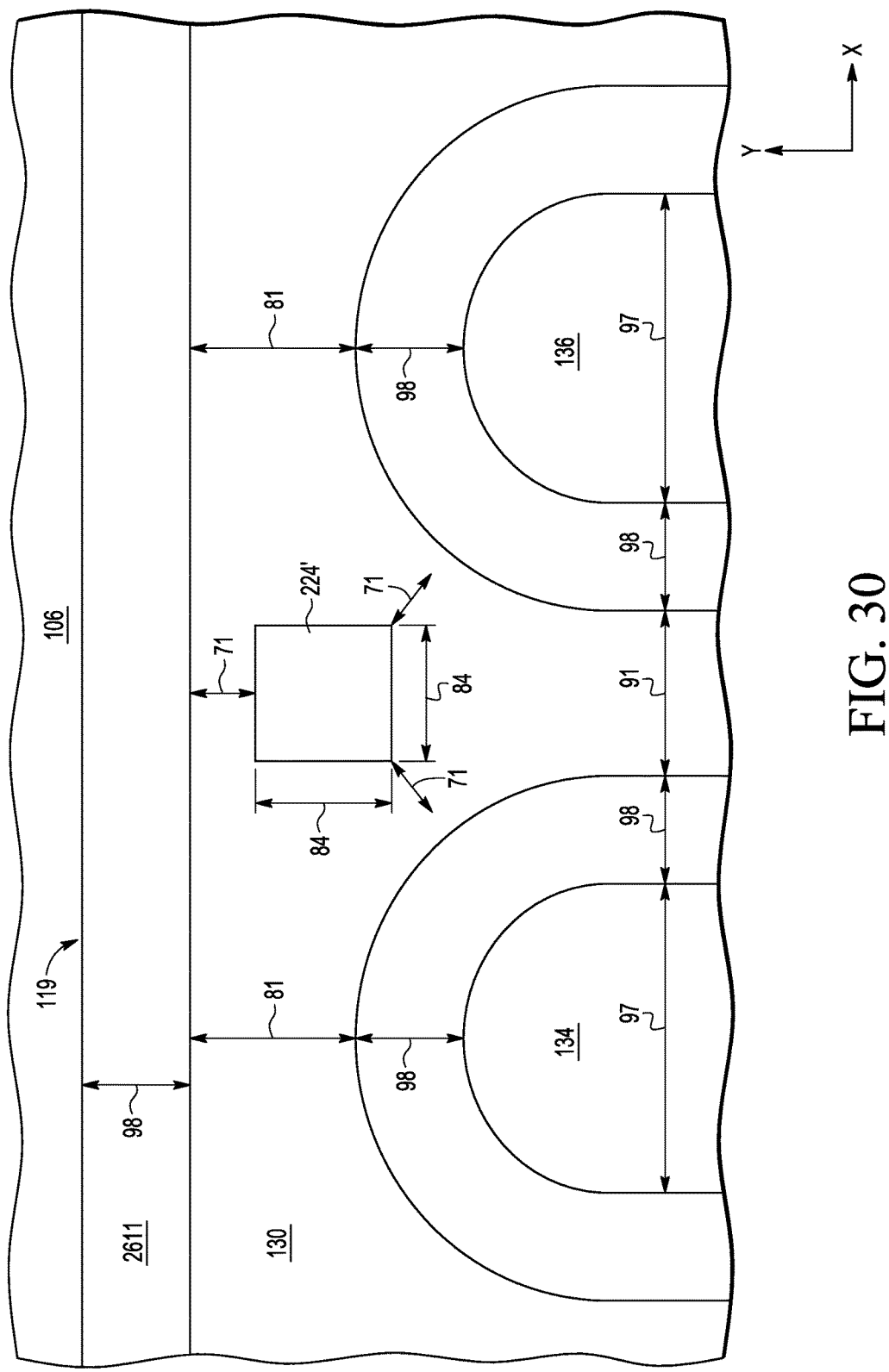
FIG. 30 illustrates a plan view of a portion of a workpiece at illustrating a particular placement of a contact according to a particular embodiment.

FIG. 30 illustrates a plan view of an EOL termination region of the workpiece 800 after manufacturing has been completed. In particular, FIG. 30 illustrates the shield electrode 130, conductive plug 224, mesas 134 and 136, a portion of the epi layer 106 that extends beyond the outer perimeter 119 of the recess that defines the mesas. The location of the various features of FIG. 30 are intended to represent their dimensions at their corresponding uppermost surfaces, which is typically near a plane that that substantially coincident to the surface of the epi layer 106 after manufacturing has been completed. It will be appreciated that the final dimensions of the features illustrate at FIG. 30 can vary from their dimensions during manufacturing. For example, during manufacturing, the mesas may have a larger dimension in anticipation of their semiconductor material being consumed during subsequent processing steps, or due to other tolerances encountered during manufacturing.

Dimension 97 represents the transverse dimension of each mesa structure. Dimension 91 represents transverse dimension of the poly shield at the active trench region. Dimension 81 represents a smallest lateral dimension between a mesa, e.g. mesa 134 or 135, to an outer edge of the poly shield 130. Dimension 98 represents the shortest dimension of the dielectric separating the poly shield 130 from the mesa 134, and separating the poly shield 130 from the outer EPI layer 106, which corresponds to the outer perimeter 119 of the trench region. Dimension 84 represents the lateral and transverse dimensions of contact 224, and can be referred to as a "diameter". It will be appreciated, in other embodiments that the contact 224 need not be square. The dimension 71 represents a dimension of a design rule for a poly1 conductive plug. In particular, the dimension 71 is the minimum spacing that needs to be maintained between a poly1 conductive plug and an outer edge of the poly1 shield 130 to which the plug. According to an embodiment, dimension 71 is at least one half dimension 84, and dimension 84 is less than or equal to 1½ times to mention 91.

By way of example, it is presumed that dimension 81 and dimension 91 are each 0.5μ, dimension 97 is 0.8μ, dimension 98 is 0.3μ, dimension 84 is 0.4μ, and dimension 71 is 0.2μ. It will be appreciated, that the presumed dimensions provide for the same spacing between the mesa pairs, and the same transverse spacing between each mesa and the outer perimeter 119. In particular, the dimension between mesa 134 and mesa 136 in the transverse direction is the sum of twice the dimension 98 plus dimension 91, which is 1.1μ in the present example. Similarly, the dimension between mesa 134 in the lateral direction and the outer perimeter 119 is equal to the sum of twice dimension 98 and the dimension 81, which is also 1.1μ in the present example.

Based upon the given dimensions, placement of the polyl contact 224 needs to be located at a region of the shield 130 having a transverse dimension of at least 0.8 microns (the sum of dimension 84 and two times dimension 71) to avoid violating the 0.2μ (dimension 71) polyl conductive plug design rule. Because the active shield between the mesa pairs is only 0.5μ, it is not possible for contact 224 to be placed in the active trench. However, the contact 224 can be placed in the termination region, which can include being partially between the mesa pairs where the shield 130 has a sufficiently large transverse dimension. In particular, as illustrated. In FIG. 30, the contact 224 is centered along a lateral line that includes a point centered between the active trench mesas pair 134 and 136. In addition, the conductive plug 224 is spaced apart from a proximal edge of the shield 130 by at least the polyl conductive plug design rule, dimension 71, of 0.2 microns, as indicated by the arrows 71 extending from the lower left top edge rand lower corners of conductive contact 224. The illustrated placement of conductive contact 224 meets the polyl conductive plug design rule by maintaining a space of greater than 0.2μ between the conductive contact 224 and edges of the shield 130. Thus, a lateral spacing between the conductive contact 224 and the edge of the shield 130 is greater than or equal to the minimum required spacing.

It will be appreciated that the location of conductive plug 224 can also be described with reference to the mesas 134 and 136 and the outer perimeter 119, as opposed to the edge of the shield 130. That is, because the edge of the shield 130 is separated from each of the mesas and from the outer perimeter 119 by dimension 98, the lateral spacing between the conductive contact 224 and either of the outer perimeter 119 or of a mesa is at least the sum of dimension 71 and dimension 98.

In the example of FIG. 30, the lower corners of the conductive plug 224 are spaced apart from edge of the polyl shield relative to mesas 134 and 136 by a dimension greater than dimension 71. It will be appreciated, therefore, that the conductive plug 224 could be placed in a lateral direction closer to the active trench of the mesa pair. For example, referring to FIG. 31, an alternate placement of the conductive plug 224 is represented by conductive plug 224' which is represented by the dashed line. Placement of the conductive plug 224' is a dimension 71 from a proximate edge of mesa of the mesa pair. Therefore, the conductive plug can not be moved any closer to the active trench. The spacing of conductive plug 224' in the lateral dimension to the proximate edge of the shield 130 is the dimension 2621, which is greater than the polyl conductive plug design rule, dimension 71. The actual dimension 2621 for the present example is approximately 0.32μ. It will be further appreciated, that the conductive plug could be located anywhere between the location of conductive plugs 224' and 224.

Figure 31:
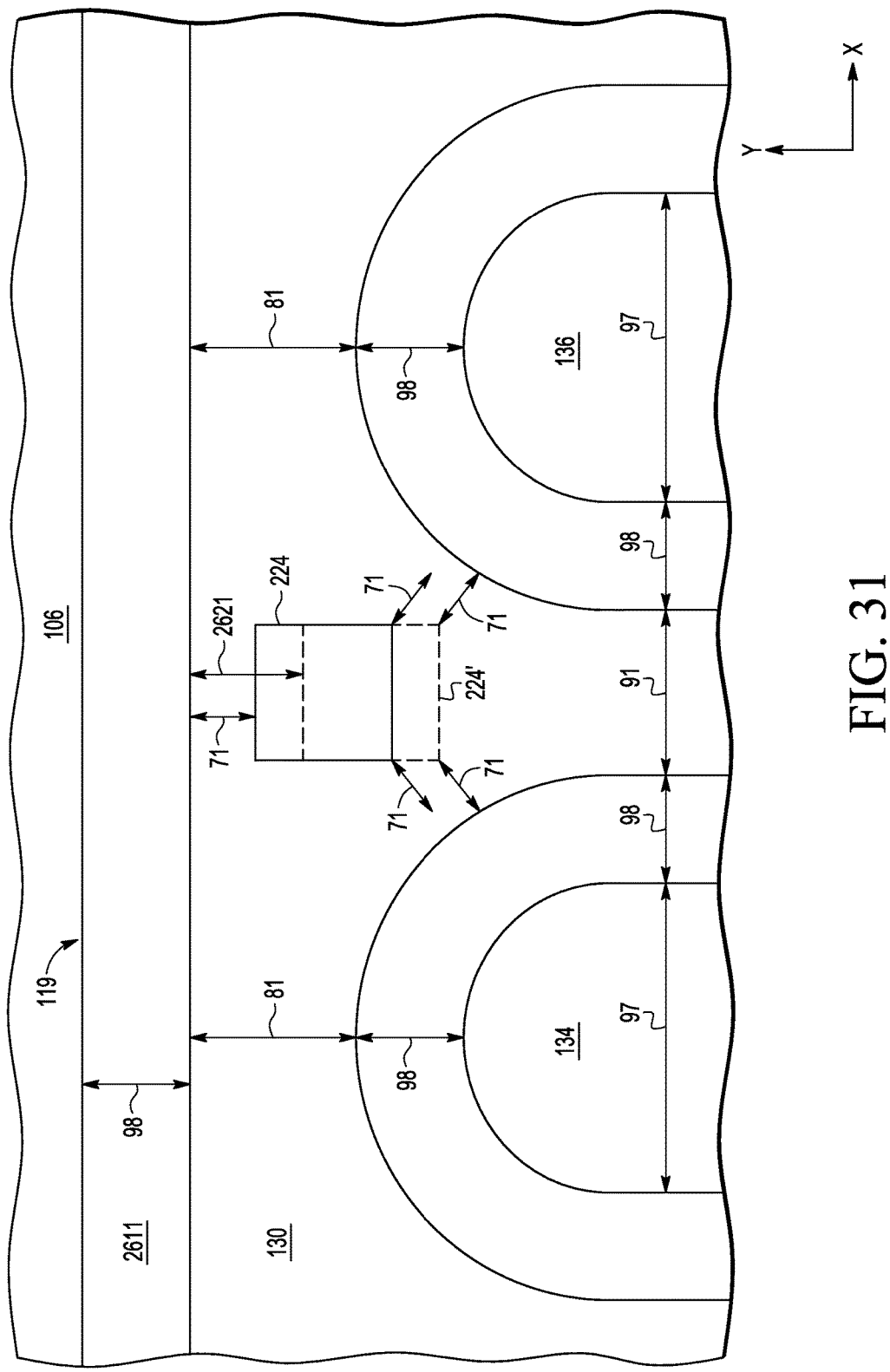
FIG. 31 illustrates a plan view of a portion of a workpiece illustrating an alternate placement of a contact according to a particular embodiment.
Figure 32:
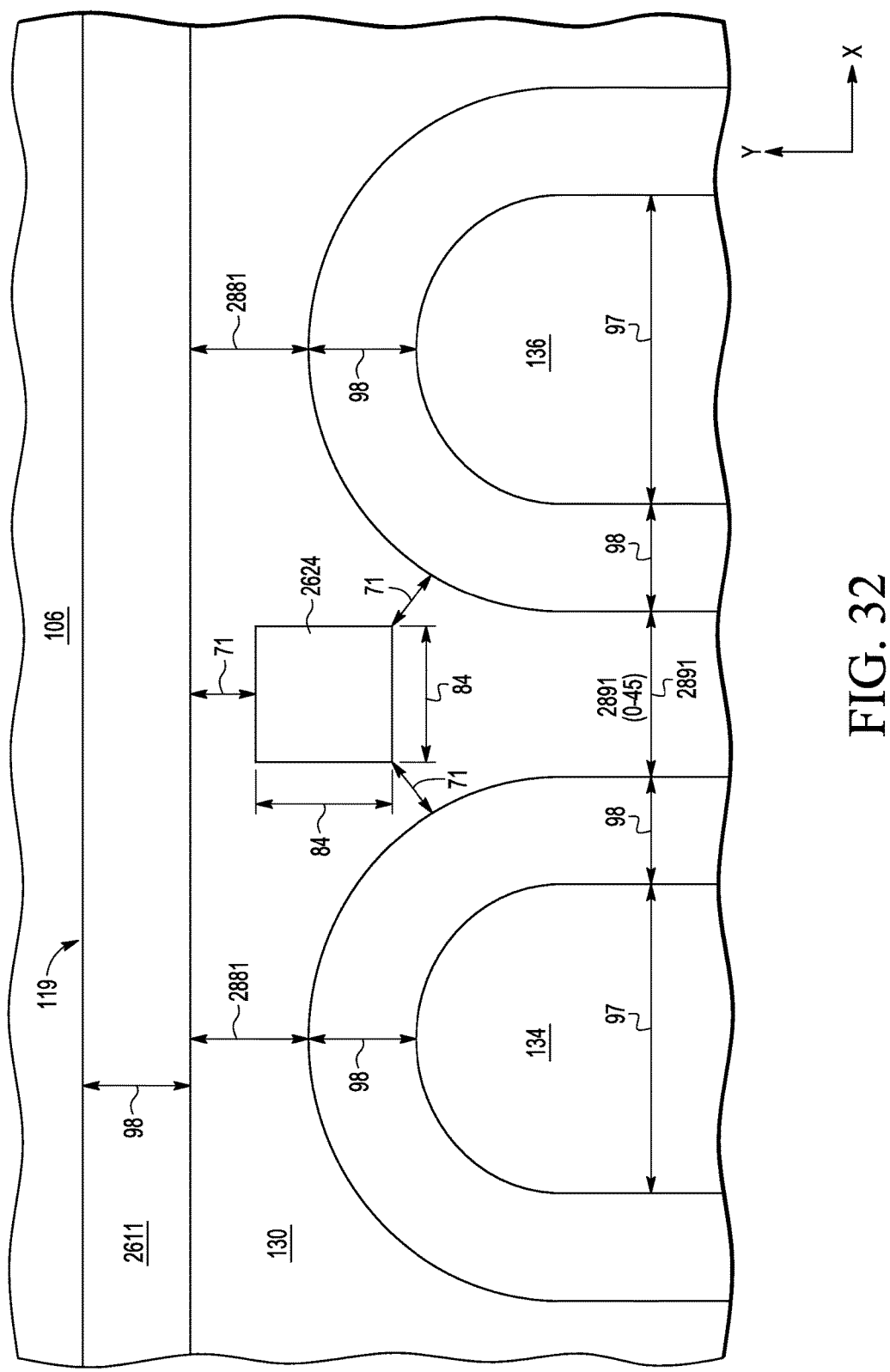
FIG. 32 illustrates a plan view of a portion of a workpiece illustrating a particular placement of a contact according to a particular embodiment.

In the example of FIGS. 30 and 31, because the lower corners or the upper perimeter of the conductive plugs 224 and 224' can be apart from edge of the polyl shield by a dimension greater than the polyl conductive plug design rule dimension, e.g., dimension 71. It will be appreciated that a more aggressive lateral and transverse dimension of the polyl shield 130, e.g., less than 0.5μ, can be obtained while continuing to meet the polyl conductive plug design rule. This is illustrated in greater detail at FIG. 32, wherein the minimum distance between conductive plug 2624 is equidistant from the three proximate edges of the Shield 130. E.g., the spacing of each lower corner of the conductive plug 2624 is spaced apart from the edge of the shield 130 by the dimension 71, and the spacing between the conductive plug 2624 in a lateral dimension to the edge of the shield 130 is also dimension 71. The dimension of the transverse width 2891 of the shield 130 between mesas 134 and 135 and the minimum lateral length 2881 of the shield 130 at the end of the mesas is approximately 0.45μ, in the present example.

Figure 33:
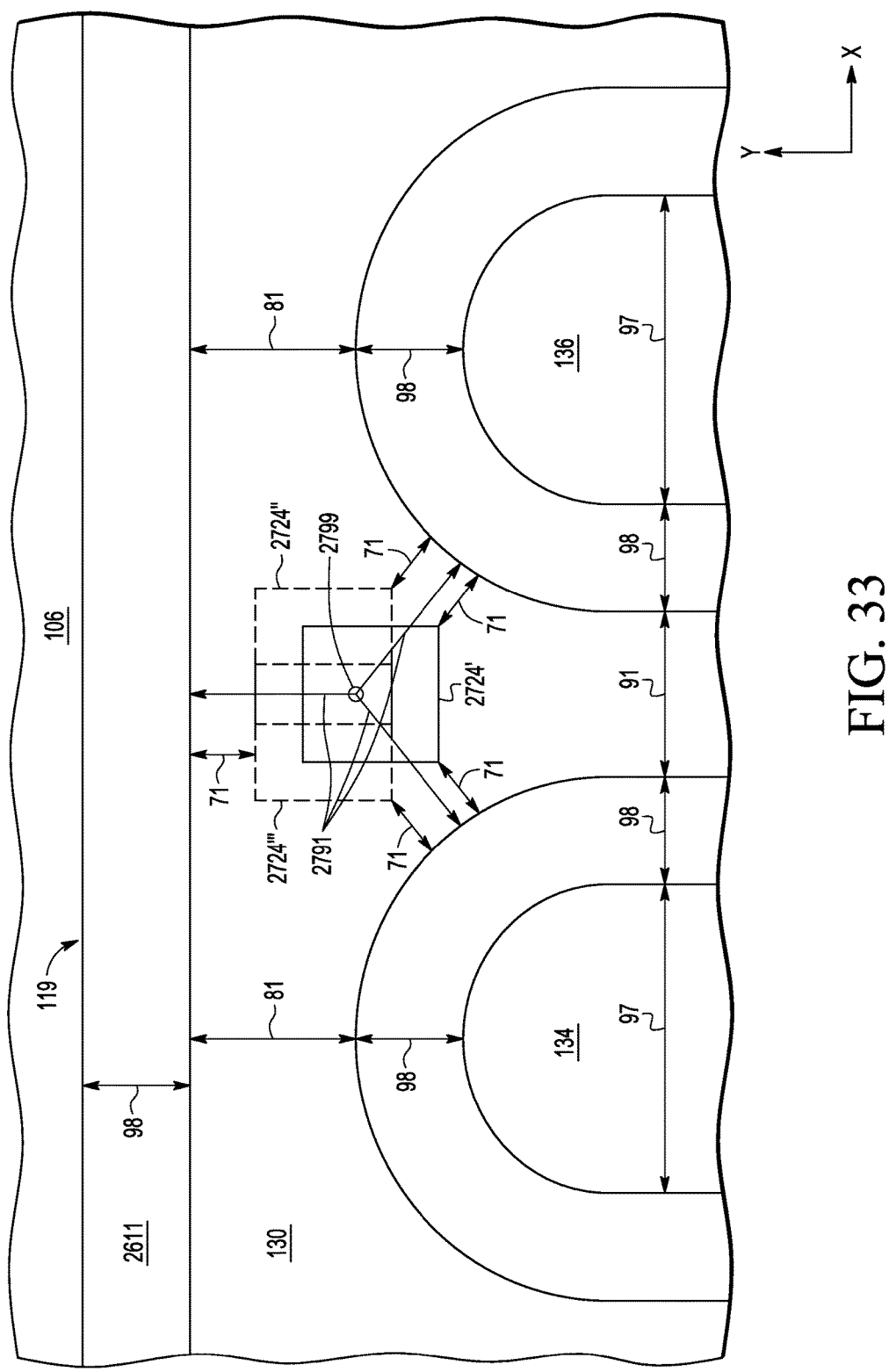
FIG. 33 illustrates a plan view of a portion of the workpiece illustrating an alternate placement of a contact according to a particular embodiment.

FIG. 33 illustrates the termination area having the dimensions assumed above, and illustrates three extreme locations (2724'/2724"/2724''') for the conductive plug 2724. The first extreme location of a conductive plug location 2724' is represented by a square having a solid line, wherein each of the lower corners of the conductive plug at location 2724' are dimension 71 from the edge of the shield 130 proximate to mesas and 136. The most upper right extreme location of a conductive plug is represented by location 2724", which is represented by a square having a dashed line. The conductive plug 2724" has its upper edge spaced apart from the edge of shield 130 by dimension 71, and its lower right corner r spaced apart from the a nearest mesa location by dimension 71. The most upper left extreme location of a conductive plug is represented by dashed location 2724''', which is represented by a square having a dashed line. The conductive plug 2724''' has its upper edge spaced apart from the edge of shield 130 by dimension 71, and its lower left corner r spaced apart from the a nearest mesa location by dimension 71.

FIG. 33 also illustrates a point 2799 that is equidistant from 1) an edge of the shield 130 proximate to mesa 134, 2) an edge of the shield 130 that is proximate to the mesa 136, and 3) an edge of the shield 130 in a lateral direction, wherein the point resides in the termination area and has a minimum dimension, as compared to other points in the set of equidistant point. As illustrated, the dimension from point 2799 to each of the three corresponding edges of shield 130 is dimension 2791. It will be appreciated, that the point 2799 is contained within the perimeter of each of the possible extreme locations 2724', 2724", and 2724' of the shield contact 2724. Having an equidistant point 2799 that is centered within the perimeter of a conductive plug that is in contact with an underlying shield layer is different than the prior art, which either places the conductive plug within the active trench region, or makes contact to a non-trench feature, such as to a conductive layer overlying the silicon layer from which the mesas are formed at a non-equidistant location due to the spacing between the mesas and the outer perimeter being larger than the spacing between mesas, which results in a conductive plug placement that does not include the point 2799.

Unless explicitly stated, the term "approximately" is used here in with respect to a dimension is intended to mean a magnitude of less than 25% of the identified dimension. For example, if feature A has a lateral dimension is the same as feature B lateral dimension, it would be understood that feature A has dimension that is +/−25% of the lateral dimension of feature B.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

For example, in the previous embodiment, the source electrode was connected to the overlying source terminal electrode without the use of an inter-level conductive plug. In another embodiment of the present disclosure, such as when the end of line conductive plugs are spaced as described beginning at FIG. 30, entry-level could be used to connect the source electrode to the overlying source terminal electrode.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A device comprising:
   a plurality of vertical transistors at a semiconductor layer coupled together in parallel residing within an outer perimeter of a recessed region of a semiconductor layer, each vertical transistor comprising a mesa having a channel region and being spaced apart from corresponding adjacent mesas in a transverse direction by a first dimension, each corresponding mesa spaced apart from the outer perimeter in a lateral direction by approximately the first dimension;
   each adjacent mesa pair associated with a point that is equidistant from an end of each mesa of the adjacent mesa pair and from the outer perimeter in the lateral direction; and
   a plurality of inter-level conductive plugs connected to a shield terminal electrode and to a device shield within the recessed region, each point being associated with a corresponding mesa pair and located within a perimeter of a corresponding one of the plurality of conductive plugs.

2. The device of claim 1, wherein between each mesa of each of the mesa pairs there is an active gate corresponding to channel regions of each mesa, and an active shield portion of the device shield.

3. The device of claim 2, wherein the device shield further comprises a termination shield that is concentric to the outer perimeter, and each end of a plurality of active shields is connected to opposing sides of the termination shield.

4. The device of claim 3, wherein a transverse dimension each conductive plug is equal to or less than a transverse dimension of a width of the active shield.

5. The device of claim 4, wherein each conductive plug is spaced apart from all edges of the device shield by a dimension that is at least one-half of a lateral dimension of the conductive plug.

6. The device of claim 1, wherein each conductive plug is spaced apart from all edges of the device shield by a dimension that is at least one-half of a lateral dimension of the conductive plug.

7. The device of claim 1, wherein the device shield further comprises a termination shield that is concentric to the outer perimeter, and each end of a plurality of active shields is connected to opposing sides of the termination shield.

8. The device of claim 1, wherein approximately the first dimension is +/−25% of the first dimension.

9. The device of claim 1, wherein approximately the first dimension is +/−10% of the lateral dimension of the conductive plugs.

10. The device of claim 1, wherein approximately the first dimension is based upon a manufacturing tolerance of a process used to manufacture the device.

11. The device of claim 1, wherein each conductive plug has a minimum diameter and a center location, and each point is within an offset dimension of the center location of its corresponding conductive plug, wherein the offset dimension is approximately 25% of the minimum diameter.

12. The device of claim 1, wherein each conductive plug has a minimum diameter and a center location, and each point is within an offset dimension of the center location of its corresponding conductive plug, wherein the offset dimension is at least 10% of the minimum diameter.

13. A device comprising:
   a semiconductor layer comprising a first major surface and a second major surface;
   a plurality of mesa structures of the semiconductor layer defined by a recess of the semiconductor layer, the recess having an outer perimeter;
   each mesa structure comprising
      two lateral major sides and two minor sides, from a plan view, each major side having a first dimension, each minor side having a second dimension, the first dimension being at least twice the second dimension;
      a first source/drain region;
      a channel region, the channel region being further from the first major surface than the first source drain region
   from the plan view, each pair of adjacent mesas comprises
      a transverse spacing between mesas of the pair that is a third dimension, a lateral spacing between an end of each mesa and a proximal location of the outer perimeter that is a fourth dimension, the third and fourth dimensions being substantially the same dimension;
   from the plan view, each pair of mesas defines a trench region of the recess comprising an active trench and a termination trench, the active trench residing between the pair of mesas, and the termination trench residing in a lateral direction between the end of each mesa and their corresponding active trench and the perimeter;

each trench region comprising
- an active portion of a shield electrode that resides at the active trench of the trench region, and a termination portion residing at the termination trench of the trench region; and
- a control electrode between the first major surface and a shield region to control a conductivity state of the channel region of each mesa of pair of mesas corresponding to the trench;

a shield termination electrode;

each shield electrode's termination region connected to a corresponding conductive plug that is further connected to a shield runner, and from the plan view, a perimeter of the conductive plug includes a point that is equidistant to an end of each mesa corresponding to the shield electrodes' pair of mesas and a proximal side of the outer perimeter.

14. The device of claim 13, wherein each mesa structure further comprises a second source/drain, wherein the channel region is between the first and second source/drain.

* * * * *